US012628609B2

(12) United States Patent
Roy et al.

(10) Patent No.: US 12,628,609 B2
(45) Date of Patent: May 12, 2026

(54) IN-CHAMBER METROLOGY OF SUBSTRATES FOR PROCESS CHARACTERIZATION AND IMPROVEMENT

(71) Applicant: Applied Materials, Inc., Santa Clara, CA (US)

(72) Inventors: Tapashree Roy, Bangalore (IN); Todd Egan, Fremont, CA (US); Viswanath Bavigadda, Bengaluru (IN); Nitin Gupta, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 17/895,952

(22) Filed: Aug. 25, 2022

(65) Prior Publication Data

US 2024/0071792 A1 Feb. 29, 2024

(51) Int. Cl.
| | |
|---|---|
| *H01L 21/67* | (2006.01) |
| *G06F 18/214* | (2023.01) |
| *G06N 20/00* | (2019.01) |
| *H10P 72/00* | (2026.01) |
| *H10P 72/30* | (2026.01) |

(52) U.S. Cl.
CPC ........ *H10P 72/0604* (2026.01); *G06F 18/214* (2023.01); *G06N 20/00* (2019.01); *H10P 72/3302* (2026.01)

(58) Field of Classification Search
CPC ........ H01L 21/67253; H01L 21/67742; G06N 20/00; G06F 18/214
See application file for complete search history.

(56) References Cited

U.S. PATENT DOCUMENTS

| | | |
|---|---|---|
| 10,886,155 B2 | 1/2021 | Zhu et al. |
| 11,177,144 B2 | 11/2021 | Lau et al. |
| 11,204,312 B2 | 12/2021 | Sade et al. |
| 2010/0292951 A1* | 11/2010 | Gaertner .................. G01J 5/02 |
| | | 702/135 |

(Continued)

FOREIGN PATENT DOCUMENTS

| | | |
|---|---|---|
| CN | 113471393 A | 10/2021 |
| KR | 20200128192 A | 11/2020 |

(Continued)

OTHER PUBLICATIONS

International Search Report and Written Opinion for International Application No. PCT/US2023/030965, mailed on Dec. 15, 2023, 9 Pages.

*Primary Examiner* — Victor A Mandala
*Assistant Examiner* — Colleen E Snow
(74) *Attorney, Agent, or Firm* — Lowenstein Sandler LLP

(57) ABSTRACT

A method includes receiving, by a processing device, first data generated by a first sensor of a substrate processing system. The first data is generated responsive to the first sensor receiving electromagnetic radiation from a substrate held by a robot arm of a transfer chamber in the substrate processing system. The method further includes processing the first data to obtain second data. The second data includes a first indication of performance of the substrate processing system. The method further includes causing, in view of the second data, performance of a corrective actions associated with the substrate processing system.

24 Claims, 9 Drawing Sheets

(56) References Cited

U.S. PATENT DOCUMENTS

| | | | | |
|---|---|---|---|---|
| 2012/0288970 A1* | 11/2012 | Hashimoto | ............. | G01J 5/026 |
| | | | | 257/E21.211 |
| 2019/0080943 A1 | 3/2019 | Kim et al. | | |
| 2019/0390985 A1 | 12/2019 | Kwok et al. | | |
| 2021/0072354 A1 | 3/2021 | Liu et al. | | |
| 2021/0272858 A1 | 9/2021 | Storek et al. | | |
| 2023/0139578 A1* | 5/2023 | Parasuram | ........ | B60W 50/0097 |
| | | | | 701/27 |

FOREIGN PATENT DOCUMENTS

| | | | |
|---|---|---|---|
| KR | 20210142772 A | 11/2021 | |
| WO | 2021254548 A1 | 12/2021 | |
| WO | 2024044274 A1 | 2/2024 | |

* cited by examiner

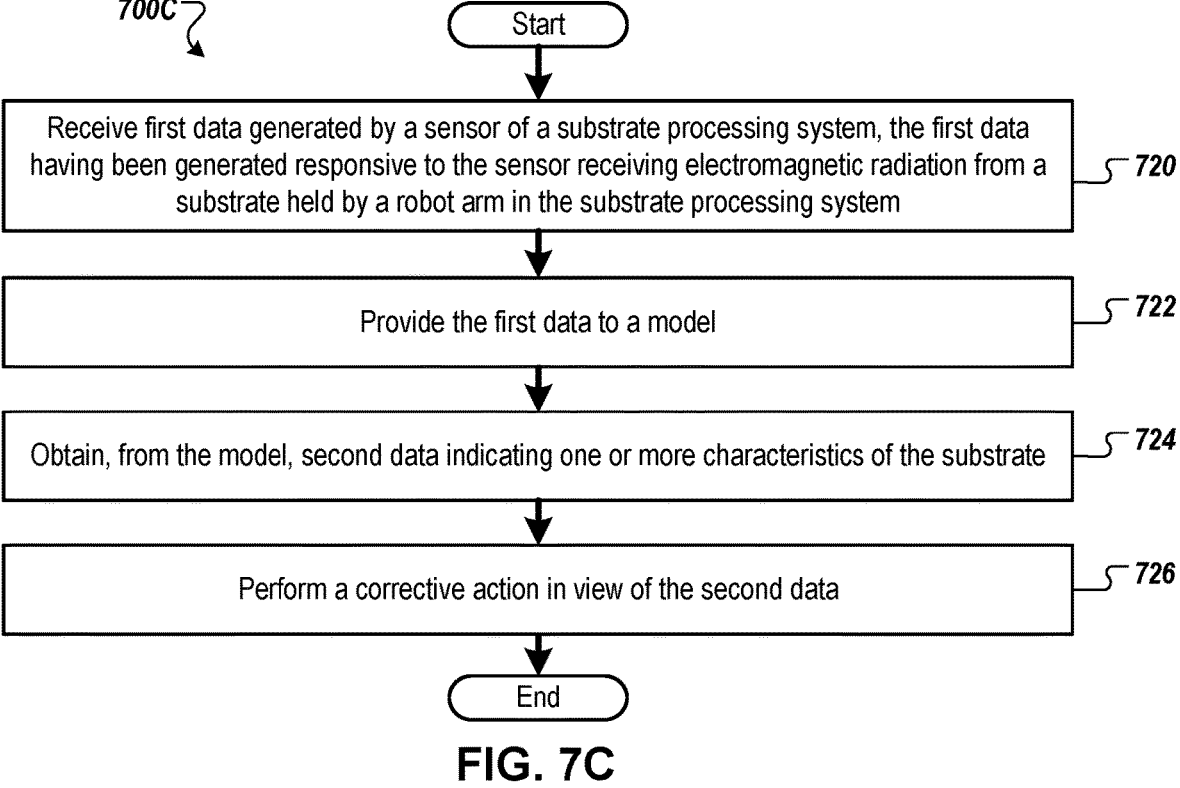

700C

Start

Receive first data generated by a sensor of a substrate processing system, the first data having been generated responsive to the sensor receiving electromagnetic radiation from a substrate held by a robot arm in the substrate processing system — 720

Provide the first data to a model — 722

Obtain, from the model, second data indicating one or more characteristics of the substrate — 724

Perform a corrective action in view of the second data — 726

End

FIG. 7C

IN-CHAMBER METROLOGY OF SUBSTRATES FOR PROCESS CHARACTERIZATION AND IMPROVEMENT

TECHNICAL FIELD

Embodiments of the present disclosure relate to process control and process learning for substrate processing system. Embodiments of the present disclosure further relate to a metrology system that is capable of generating metrology measurements of substrates as those substrates are held by a robot arm (e.g., of a transfer chamber).

BACKGROUND

Chambers are used in many types of processing systems. Examples of chambers include etch chambers, deposition chambers, anneal chambers, and the like. Typically, a substrate, such as a semiconductor wafer, is placed on a substrate support within the chamber and conditions in the chamber are set and maintained to process the substrate. Detailed understanding of processing conditions, the effect of conditions on a substrate, and evolutions of these parameters over time enables tight control of product properties. Measuring one or more properties of a substrate (e.g., performing metrology operations) may inform decisions or actions associated with updating or maintaining processing conditions of substrates.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

A method includes receiving, by a processing device, first data generated by a first sensor of a substrate processing system. The first data is generated responsive to the first sensor receiving electromagnetic radiation from a substrate held by a robot arm of a transfer chamber in the substrate processing system. The method further includes processing the first data to obtain second data. The second data includes a first indication of performance of the substrate processing system. The method further includes causing, in view of the second data, performance of a corrective actions associated with the substrate processing system.

A substrate processing system includes a process chamber, a transfer chamber, a robot arm of the transfer chamber, a sensor, and a processing device. The transfer chamber is coupled to the process chamber. The robot arm is configured to transfer a substrate between the process chamber and the transfer chamber. The sensor has a field of view. At least a portion of the field of view includes at least a portion of the substrate as the substrate is transferred to or from the process chamber by the robot arm. The sensor is to receive electromagnetic radiation that has interacted with the substrate. The processing device is to process data. The data is generated responsive to the sensor receiving electromagnetic radiation. The processing device is to determine at least one of (i) one or more indications of performance of the substrate processing system or (ii) one or more properties of the substrate.

A non-transitory machine readable storage medium stores instruction. The instructions, when executed, cause a processing device to perform operations. The operations include receiving first data generated by a first sensor of a substrate processing system. The first data is generated responsive to the first sensor receiving electromagnetic radiation from a substrate held by a robot arm of a transfer chamber of the substrate processing system. The operations further include processing the first data to obtain second data. The second data includes first one or more property values of the substrate. The operations further include causing, in view of the second data, performance of a corrective action associated with the substrate processing system.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 7C is a flow diagram of a method 700C for predicting characteristics of a substrate from probe data collected from within a processing system, according to some embodiments.

DETAILED DESCRIPTION OF EMBODIMENTS

Figure 1:
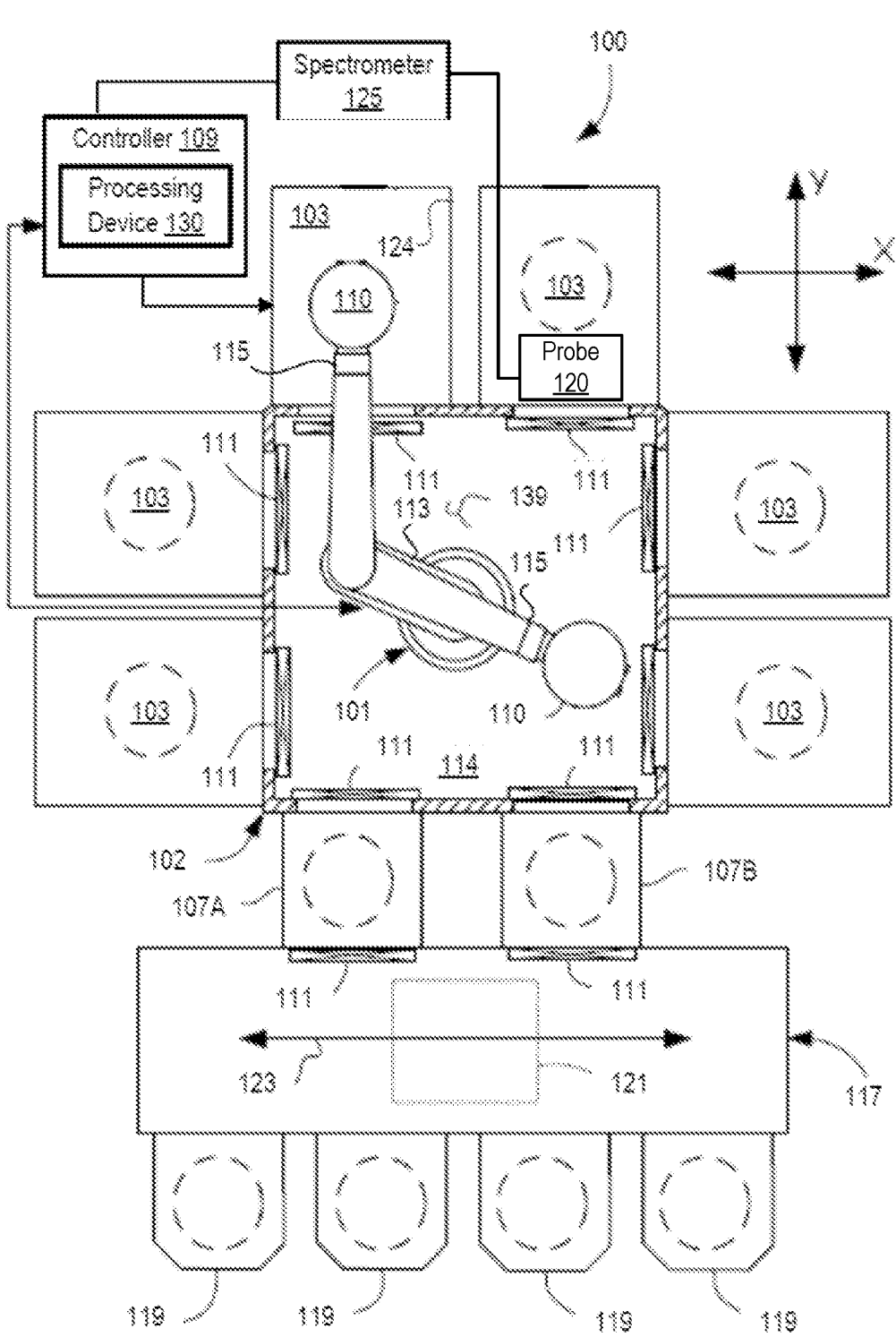
FIG. 1 is a top schematic view of an example processing system, according to some embodiments.

Described herein are methods, systems, devices, etc., related to performing measurements of a substrate in a controlled environment. For example, methods, systems, and devices of the present disclosure may relate to performing metrology measurements of a substrate in vacuum, may relate to throughput-transparent metrology measurements for substrates in processing, may relate to measurements of a substrate in an environmentally-controlled chamber indicative of processing conditions associated with the substrate, etc.

In some systems, substrates are processed and/or manufactured in one or more processing chambers. Processing chambers may distinguish the processing environment (e.g., the region of space in which substrates are processed) from ambient conditions. For example, substrate processing may be performed at a controlled gas pressure, under a controlled gas mixture, under vacuum, etc.

In some systems, multiple processing chambers may be coupled to a single processing system, e.g., a number of processing chambers may each be coupled to a central transfer chamber. The environment within the processing chambers, within the transfer chamber, within various other chambers (e.g., loading chambers), etc., may be a controlled environment.

In some systems, a substrate processing systems may be configured to manufacture multi-layer substrates. One or more operations may be performed to generate a layer of a substrate, second one or more operations may be performed to generate a further layer of the substrate, etc. In some systems, a substrate may be transferred between processing chambers during processing, e.g., a first processing chamber coupled to a transfer chamber may be configured to perform a first operation for processing the substrate, a second processing chamber coupled to the transfer chamber may be configured to perform a second operation for processing the substrate, etc. A substrate may be processed in multiple stages in multiple processing chambers, without interacting with ambient atmospheric conditions, without leaving the controlled environment of the processing system, etc.

In some systems, a substrate may be sensitive to atmospheric conditions. A substrate (e.g., materials of a substrate, films of a substrate, shape or dimensions of a substrate, etc.) may be damaged, changed, or altered upon introduction to atmospheric conditions, an uncontrolled atmosphere, or the like. In some systems, a substrate may be protected (e.g., may have a final, atmospheric contaminant-resistant layer deposited) before the substrate is removed from the processing system.

In some systems, measurements of a substrate (e.g., metrology measurements) are to be performed on a manufactured substrate. Metrology of a substrate may provide indications of substrate performance (e.g., predictions of satisfactory/unsatisfactory performance of the substrate), indications of substrate processing performance (e.g., quality of the substrate processing procedure). Metrology may be performed in a standalone metrology system (e.g., a room, facility, area, or the like, separate from the substrate processing system) or an inline metrology system (e.g., a metrology system coupled to the substrate processing system), or the like.

In some systems, metrology operations may be performed outside the processing system, e.g., a substrate may leave a controlled environment before it is measured, the substrate may be in contact with atmospheric/ambient conditions before it is measured, the substrate may have metrology operations performed under ambient conditions, or the like. In some systems, metrology operations may occur separated in time from processing operations. An inline metrology system may receive a substrate, perform measurements on the substrate, etc., minutes after a final processing operation is performed. Any information from the substrate (e.g., to be used in control or adjustment of future processes) may not be available for a time (e.g., due to this delay). A standalone metrology system may receive a substrate hours after a final substrate processing operation is performed. Many other substrates may be processed between the processing of the substrate and generation of metrology data from the standalone metrology system.

In some systems, metrology operations may be performed upon a subset of substrates produced by a substrate processing system. For example, a random selection of substrates may be flagged for further metrology, a substrate may be flagged periodically for further metrology (e.g., one substrate in every n substrates produced), a selection of substrates may be flagged for metrology based on performance metrics (e.g., sensor data associated with the processing of these substrates), or the like. In some embodiments, a subset of substrates may be flagged for metrology operations, have metrology operations performed upon them, etc., due to a time cost associated with performing the metrology operations. Inclusion of more substrates in metrology operations may reduce processing throughput of the substrate processing system.

The present disclosure may address one or more of the shortcomings of conventional substrate processing and/or metrology systems. In some embodiments, a metrology system that generates measurements based on receiving electromagnetic (e.g., optical) radiation from a substrate is included as a part of the processing system. The metrology system may be configured to receive radiation emitted by the substrate, radiation transmitted through the substrate, radiation reflected by the substrate, or the like. The metrology system may include a probe, e.g., a device for collecting electromagnetic radiation from the substrate. The probe may be disposed within the processing system, e.g., the probe may be within a processing chamber, within a transfer chamber, within a load lock, within a mainframe or chamber body, within a factory interface, may be within a controlled environment, etc. The probe may receive electromagnetic radiation from the substrate while the substrate is in a controlled environment (e.g., processing environment, vacuum, inert environment, etc.).

The probe which is to receive electromagnetic radiation from the substrate may be disposed along a path that the substrate travels during or between processing operations. For example, the probe may be disposed above a region of a chamber or component configured to contain one or more substrates (e.g., the probe may be suspended from a lid or top wall of a transfer chamber, process chamber, load lock, slit valve assembly, factory interface, and so on). The probe may have a field of view from which the probe may receive electromagnetic radiation. The field of view of the probe may be situated to include one or more regions of the chamber configured to contain substrates. For example, a probe near the top of a chamber may have a field of view directed below the probe. The field of view of the probe may intersect a region that substrates traverse as they are being transferred, e.g., from one chamber to another chamber. For example, a probe may be disposed near an interface between a processing chamber and a transfer chamber. As a robot arm (e.g., associated with the transfer chamber, configured to transfer one or more substrates within the processing system, etc.) transfers a substrate into and/or out of a processing chamber, a portion of the substrate may pass through the field of view of the probe. In some embodiments, the probe may be positioned differently. For example, the probe may be within the transfer chamber, but not associated with a particular processing chamber coupled to the transfer chamber. In another example, the probe may be disposed in a slit valve assembly that separates a processing chamber from a transfer chamber. In some embodiments, a first process chamber may be utilized for a first set of operations associated with processing a substrate, and the substrate may be moved to a second chamber for a second set of operations. A probe may be disposed such that a substrate passing through the transfer chamber from the first processing chamber to the second processing chamber may intersect the field of view of the probe.

In some embodiments, as a substrate passes through the field of view of the probe, one or more measurements are made. In some embodiments, the probe may provide radiation received from the substrate (e.g., via one or more optical elements, via a fiber optic cable, etc.) to a spectrometer, to one or more detectors, to one or more cameras or imagers, etc. In some embodiments, one or more measurements may be made while the substrate is being transferred between locations, e.g., the substrate may be moving continuously while radiation is being collected by the probe. In some embodiments, the probe may be placed such that the substrate passes through the field of view of the probe naturally, e.g., receiving electromagnetic radiation from the substrate may not increase processing time, completion time, manufacturing time, or the like of the substrate. In some embodiments, a number of data points are taken while the substrate is transferred through the field of view of the probe. For example, a number of data points along a diameter of the substrate may be collected. In some embodiments, an electromagnetic source may be provided, and radiation that is reflected by or transmitted through the substrate may be collected by the probe. In some embodiments, the probe may include a pyrometer, and emissive radiation may be collected from the substrate.

In some embodiments, multiple probes may be employed (e.g., to map a larger portion of the substrate). In some embodiments, a further detection system may be used, e.g., an object detections system may be used to synchronize data collection with substrate presence in the field of view, to synchronize robot operation with spectrometer operation, or the like. In some embodiments, a robot for transferring the substrate may be instructed to adjust a path of the substrate through a processing system to facilitate measurement by the probe. In some embodiments, a robot may cause the substrate to be passed through the field of view of the probe multiple times, may cause the substrate to remain within the field of view of the probe for an extended time, may transfer the substrate along a path such that a larger portion of the substrate passes through the field of view of the probe than would pass through were the substrate to be passed directly from one chamber to another, or the like. In some embodiments, one or more portions of a substrate may pass the field of view of one or more probes multiple times during processing. For example, a substrate may be transferred into a processing chamber for deposition of a film. The substrate may pass through the field of view of a probe, may provide radiation to the probe, etc., as it is being transferred to the processing chamber. After processing, the substrate may be transferred to another chamber, and may again pass through the field of view of the probe.

A processing device (e.g., a computer processor) may be provided with data from the spectrometer or other sensor. One or more metrics associated with the measured substrate may be inferred by the processing device. In some embodiments, the processing device may generate an indication of one or more properties of the substrate. The processing device may use data based on electromagnetic radiation received from the substrate to determine and/or predict one or more properties of the substrate. Thickness of a film (e.g., a film deposited on a substrate), film composition, or the like may be determined by the processing device. In some embodiments, data from a spectrometer may be provided to a physics-based model to determine one or more properties of a substrate. In some embodiments, data from a spectrometer and/or other sensor may be provided to a machine learning model which is trained to receive spectrometer data and generate as output an indication of substrate properties.

In some embodiments, the processing device may generate an indication of performance (e.g., quality of performance) of one or more processing operations associated with the substrate. The processing device may receive spectral data from the spectrometer. The processing device may provide the spectral data to a trained machine learning model, configured to generate as output a prediction of processing conditions under which the substrate had been processed previously. In some embodiments, the processing device may provide spectral data to a machine learning model configured to cause performance of a corrective action (e.g., schedule maintenance, update a process recipe, provide an alert to a user, etc.).

Aspects of the present disclosure provide one or more technical advantages over conventional systems. The present disclosure enables measurements indicative of processing of a substrate to be performed in a controlled environment (e.g., within the processing system, in the transfer chamber, in a process chamber, etc.). In conventional inline or standalone metrology systems, an atmosphere-sensitive substrate may not be measured. For example, a protective layer may be applied to a substrate before removal from the controlled environment, which may obstruct measurement of other layers of the substrate.

Aspects of the present disclosure enable measurement of a substrate multiple times throughout processing. For example, as a substrate is moved into or out of a process chamber, measurements may be taken by a probe which may be indicative of one or more properties of the substrate, one or more processing conditions of the substrate, etc. In some embodiments, a substrate may be measured several times throughout processing, e.g., between a series of processing operations. Layers that may be obscured by performing metrology on a full stack of substrate layers may be more accurately measured in this way.

Aspects of the present disclosure enable measurement of a substrate quickly after one or more processing operations are performed on the substrate (e.g., seconds after processing, minutes after processing, etc.). In some systems, metrology of one or more produced substrates may be utilized in performing corrective actions, e.g., updating process recipes, scheduling maintenance, providing alerts to a user, etc. In some conventional systems, there may be a significant delay (e.g., in terms of time, additional substrates processed before changes may be made, or the like) between processing of a substrate and performance of metrology operations associated with the substrate. According to the present disclosure, a substrate may be measured (e.g., electromagnetic radiation may be received by a probe from the substrate) immediately after processing. Updates to processing conditions, processing recipes, or the like may be initiated and/or performed quickly, reducing wasted materials, energy, time, etc., of operating a substrate processing system with sub-optimal processing conditions.

Aspects of the present disclosure enable metrology measurements of a substrate to be performed while the substrate is being transferred through the processing system. For example, a transfer robot may be operating normally, and while the transfer robot is operating normally (e.g., as the robot would operate without a probe included in the processing system) the electromagnetic probe may receive radiation from the substrate, the processing device may determine one or more properties of the substrate, etc. Aspects of the present disclosure may enable metrology to be performed without an effect on throughput of the substrate processing system (e.g., the metrology system may be throughput transparent), without a significant effect on throughput (e.g., metrology operations according to the present disclosure may increase throughput by an amount of time less than a threshold value), etc. Aspects of the present disclosure may enable more substrates of the substrate processing system to be measured, e.g., each substrate processed by the processed system may be measured by the metrology system, a portion of substrates processed by the processing system may be measured by the metrology system (e.g., each substrate that is processed in a first process chamber of the substrate processing system), etc. In some embodiments, feedback control, recipe updates, scheduled maintenance, etc., may be based on metrology of substrates. Enabling the measurement of a greater portion of substrates may increase the certainty of a prediction of a corrective action (e.g., additional data may increase statistical likelihood of an accurate corrective action). Measurement of a greater portion of substrates processed by the substrate processing system may facilitate the processing system avoiding making erroneous changes to one or more processing recipes, may facilitate the processing system making appropriate (e.g., increases the likelihood of a produced substrate meeting target performance metrics) corrective actions (e.g., by increasing certainty of a detected variance from ideal conditions in a process chamber), etc. This may provide a technical advantage to the substrate processing system by reducing energy, time, and material devoted to performing sub-optimal processing operations, may reduce energy, time, material, and defective product disposal costs associated with an increase in likelihood of producing a defective product, etc.

In one aspect of the present disclosure, a method includes receiving, by a processing device, first data generated by a first sensor of a substrate processing system. The first data is generated responsive to the first sensor receiving electromagnetic radiation from a substrate held by a robot arm of a transfer chamber in the substrate processing system. The method further includes processing the first data to obtain second data. The second data includes a first indication of performance of the substrate processing system. The method further includes causing, in view of the second data, performance of a corrective actions associated with the substrate processing system.

In another aspect of the present disclosure, a substrate processing system includes a process chamber, a transfer chamber, a robot arm of the transfer chamber, a sensor, and a processing device. The transfer chamber is coupled to the process chamber. The robot arm is configured to transfer a substrate between the process chamber and the transfer chamber. The sensor has a field of view. At least a portion of the field of view includes at least a portion of the substrate as the substrate is transferred to or from the process chamber by the robot arm. The sensor is to receive electromagnetic radiation that has interacted with the substrate. The processing device is to process data. The data is generated responsive to the sensor receiving electromagnetic radiation. The processing device is to determine at least one of (i) one or more indications of performance of the substrate processing system or (ii) one or more properties of the substrate.

In another aspect of the present disclosure, a non-transitory machine readable storage medium stores instruction. The instructions, when executed, cause a processing device to perform operations. The operations include receiving first data generated by a first sensor of a substrate processing system. The first data is generated responsive to the first sensor receiving electromagnetic radiation from a substrate held by a robot arm of a transfer chamber of the substrate processing system. The operations further include processing the first data to obtain second data. The second data includes first one or more property values of the substrate. The operations further include causing, in view of the second data, performance of a corrective action associated with the substrate processing system.

FIG. 1 is a top schematic view of an example processing system 100, according to some embodiments. Processing system 100 may be a substrate processing system. Processing system 100 includes a transfer chamber robot 101 and a factory interface robot 121 each adapted to pick and place substrates 110 (sometimes referred to as "wafers" or "semiconductor wafers") from or to a destination in an electronic device processing system such as the processing system 100 illustrated in FIG. 1. However, any type of electronic device substrate, mask, or other silica-containing substrate (generally referred to as "substrates" herein) may be conveyed and transferred by the disclosed robots. For example, the destination for the substrates 110 may be one or more processing chambers 103 and/or one or more of the load lock apparatus 107A, 107B that may be distributed about and coupled to a transfer chamber 114. As shown, substrate transfers may be through slit valves 111, for example.

Processing system 100 may further include a mainframe 102 including the transfer chamber 114 and a number of processing chambers 103. A housing of the mainframe 102 includes the transfer chamber 114 therein. The transfer chamber 114 may include top wall (not shown), bottom wall (floor) 139, and side walls, and may include a controlled environment. The controlled environment may include vacuum conditions, a controlled pressure (e.g., different from ambient atmospheric pressure), a controlled gas environment (e.g., inert gas such as argon or nitrogen gas or a gas mix), or the like. In the depicted embodiment, the transfer chamber robot 101 is mounted to the bottom wall (floor) 139. However, the transfer chamber robot 101 could be mounted elsewhere, such as to the top wall.

In various embodiments, processing chambers 103 may be adapted to carry out any number of processes on substrates 110. The processes may include deposition, oxidation, nitration, etching, polishing, cleaning, lithography, metrology (e.g., integrated metrology), or the like. Other processes may be carried out as well. The load lock apparatus 107A, 107B may be adapted to interface with a factory interface 117 or other system component, that may receive substrates 110 from substrate carriers 119 (e.g., Front Opening Unified Pods (FOUPs)) that may be docked at load ports of the factory interface 117, for example. The factory interface robot 121 (shown dotted) may be used to transfer the substrates 110 between the substrate carriers 119 and each load lock apparatus 107A, 107B. Transfers of the substrates 110 may be carried out in any sequence or direction. The factory interface robot 121 may be identical (or similar) to the transfer chamber robot 101 in some embodiments, but may further include a mechanism to allow the factory interface robot to move in either lateral direction and indicated by arrow 123. Any other suitable robot may be used as the factory interface robot 121. In some embodiments, system 100 may be coupled to (e.g., interface with) a metrology system, e.g., an integrated metrology system, an inline metrology system, etc.

In embodiments, and by way of exemplified explanation for any robot, the transfer chamber robot 101 includes at least one arm 113 (e.g., a robot arm) and at least one end effector 115 coupled to the arm 113. The end effector 115 is controllable by the transfer chamber robot 101 in order to pick up a substrate 110 from a load lock apparatus 107A or 107B, guide the substrate 110 through one of the slit valves 111 of a processing chamber 103, and accurately place the substrate 110 onto a substrate support of the processing chamber 103. In some embodiments, end effector 115 may include a blade for supporting substrate 110. In some embodiments, end effector 115 may support a first portion of substrate 110, e.g., may be ring-shaped enabling some portion of substrate 110 to be visible from the bottom while substrate 110 is supported by end effector 115.

In various embodiments, one or more of the processing chambers 103 may include a probe 120 (e.g., a device for collecting electromagnetic radiation), at least a part of which is within a chamber of processing system 100. In some embodiments, probe 120 may be within a processing chamber 103 (as shown). In some embodiments, probe 120 may be within transfer chamber 114. In some embodiments, probe 120 may be within a slit valve assembly that includes slit valve 111. In some embodiments, probe 120 may be within a load lock 107A-B. In some embodiments, probe 120 may be within factory interface 117. In some embodiments, probe 120 may include optical components designed to couple radiation collected from within a chamber of processing system 100 and couple that radiation into one or more fiber optic cables/cores. In some embodiments, probe 120 may be disposed above a path of a substrate (e.g., may be suspended from or embedded in a top wall of processing system 100). In some embodiments, probe 120 may be disposed below a path of a substrate. In some embodiments, multiple probes may be included in a processing system 100, processing chamber 103, transfer chamber 114, etc.

In some embodiments, a field of view of the probe (e.g., a spatial region from which the probe is configured to receive electromagnetic radiation) may intersect with a path of substrate 110, a path of end effector 115, may be proximate to a coupling between chambers (e.g., proximate to slit valve 111), etc. In some embodiments, probe 120 may be configured to receive radiation reflected from a surface of the substrate. In some embodiments, probe 120 is configured to receive radiation transmitted through the substrate. In some embodiments, probe 120 is configured to receive radiation emitted by the substrate. In some embodiments, probe 120 may include an array of devices, e.g., devices with different (overlapping, non-overlapping, or the like) fields of view, devices with different functions (e.g., devices that receive radiation of different portions of the electromagnetic spectrum, devices that are configured to receive reflected, emitted, or transmitted light, etc.

In some embodiments, probe 120 may be configured to receive radiation from substrate 110 while substrate 110 is being transferred from a first portion of processing system 100 to a second portion of processing system 100. For example, probe 120 may be disposed such that a field of view of probe 120 may intersect with a path through which transfer arm 113 may transmit substrate 110. Probe 120 may receive radiation from substrate 110 while substrate 110 is being transferred from transfer chamber 114 to processing chamber 103. Probe 120 may receive radiation from substrate 110 while substrate 110 is being transferred form processing chamber 103 to transfer chamber 114.

In some embodiments, light received by probe 120 may be directed to a spectrometer 125 for analysis. Light received by probe 120 may be focused into a fiber optic cable that is coupled to a spectrometer 125 for analysis, e.g., spectral analysis. Spectrometer 125 may perform operations (e.g., spectrometer 125 may include or be coupled to a processing device) to determine one or more spectra of the light that may be used to determine at least one optical property of the substrate. In some embodiments, light will be received from the substrate before substrate processing. In some embodiments, light will be received from the substrate after substrate processing. In some embodiments, light will be received from the substrate between processing operations. The probe 120 and the spectrometer 125 may comprise an optical sensor associated with the processing chamber 103, with the transfer chamber 114, with processing system 100, etc. Probe 120 and the spectrometer 125 may comprise a metrology system to be operated in a controlled environment. Probe 120 and spectrometer 125 may comprise an in-vacuum metrology system. The optical sensor may detect at least one property of a material of substrate 110. In some embodiments, by way of a thin-film optical calculation by a processing device (e.g., processing device 130), the optical sensor may provide sensor data indicative of the thickness of a material of substrate 110. For example, the optical sensor may be used to determine a thickness of the latest film applied to substrate 110, the latest film exposed (e.g., after an etch operation) of substrate 110, etc. The optical sensor may be used to determine a total thickness of the substrate. The optical sensor may be used to determine additional characteristics of the substrate. The optical sensor may be used to determine a geometry of the substrate (e.g., a measurement of one or more dimensions of the substrate). The optical sensor may be used to determine a chemical or physical composition of the substrate or a portion of the substrate. The optical sensor may be used to classify, analyze, and/or characterize a pattern of a patterned substrate.

In some embodiments, processing system 100 may further include a source of electromagnetic radiation, e.g., that is optically coupled to probe 120 (e.g., probe 120 is configured to receive radiation generated by the source). In some embodiments, light received by probe 120 may be reflected from substrate 110. In some embodiments, radiation may be provided to substrate 110 from a location near probe 120, from a fiber core bundled with a fiber cord of probe 120, from the same side of substrate 110 (e.g., top side, bottom side, etc.) as probe 120, etc. Radiation may be provided to substrate 110 by a radiation coupling device that is embedded in a wall of the chamber, supported by a bottom wall of the chamber (e.g., bottom wall 139), suspended from a top wall of the chamber, etc. Light received by probe 120 may be transmitted through substrate 110. Radiation may be provided to substrate 110 from a location disposed opposite (e.g., with respect to substrate 110) from probe 120. For example, probe 120 may be suspended from and/or near a top wall of processing system 100, and radiation may be provided from near the bottom wall 139. In some embodiments, the system may include multiple probes, may include one or more arrays of probes, may include probes disposed above and/or below the substrate, etc.

A controller 109 (e.g., a tool and equipment controller) may control various aspects of the processing system 100, e.g., gas pressure in the processing chamber 103, individual gas flows, spatial flow ratios, temperature of various chamber components, and radio frequency (RF) or electrical state of the processing chamber 103. Controller 109 may receive signals from and send commands to the factory interface robot 121, the transfer chamber robot 101, one or more sensors, and/or other processing components of processing system 100. Controller 109 may thus control the initiation and cessation of processing, may adjust a deposition rate, type or mix of deposition composition, and the like. The controller 109 may further receive and process sensing data from various sensors, e.g., sensors associated with processing system 100.

In various embodiments, the controller 109 includes (or is coupled to) a processing device 130 and is coupled to the spectrometer 125. The processing device 130 may be configured to receive and process sensor data, including the results of spectral analysis performed by the spectrometer 125. Processing device 130 may be configured to accept multiple measurements and perform signal processing, e.g., configured to isolate effects of a thin film (e.g., from the optical influence of plasma generation) by receiving data collected with and without an external light source. Processing device 130 may calculate the spectral signal (e.g., indicative of one or more characteristics of substrate 110) by subtracting a second measurement from a first measurement, e.g., a second spectrum from a first spectrum. The processing device 130 may then fit the reflectometry signal to a thin film optical model to determine information that includes one or more optical thin film properties of the process film layer. From the thin film optical model, processing device 130 may determine one or more characteristics of a process product included in substrate 110. Characteristics may be calculated by processing device 130, including thickness, reflectance, chemical character, etc. Depending on results of analyzing the one or more optical film properties, processing device 130 (e.g., the controller 109) may perform one or more actions. For example, processing device 130 may direct processing chamber 103 in a process change or adjustment. For example, controller 109 may adjust a processing parameter or setting, such as a rate of deposition, a type or mix of deposition composition, timing of performing a cleaning process within the processing chamber, and other actions that will be discussed in more detail with reference to FIGS. 7A-C. Additionally, in some embodiments, controller 109 may cause calibration of one or more sensors of processing chamber 103 based on results of analyzing the one or more optical film properties, may perform chamber matching based on results of analyzing the one or more optical film properties, identify chamber drift based on results of analyzing the one or more optical film properties, and so on.

In some embodiments, processing device 130 may perform analysis that is not directed at determining one or more properties of substrate 110. Processing device 130 may receive spectral data from spectrometer 125 and utilize spectral data to determine one or more indications of performance of processing system 100 (e.g., quality of performance, quality of processing, etc.). In some embodiments, processing device 130 may provide data from spectrometer 125 (e.g., spectral data, processed spectral data, input vectors based on spectral data, etc.) to a trained machine learning model. The trained machine learning model may be configured to generate as output one or more indications of processing conditions associated with substrate (e.g., processing conditions under which the substrate was processed). The trained machine learning model may be configured to generate as output one or more corrective actions (e.g., indications of corrective actions, cause performance of corrective actions, etc.) associated with processing system 100. Corrective actions may include updating a process recipe, updating a non-process recipe (e.g., update a cleaning recipe, update a seasoning recipe, update a calibration recipe, update a qualification recipe, etc.), updating an equipment constant, scheduling preventative maintenance (e.g., cleaning, calibration, component replacement, etc.), scheduling corrective maintenance, providing an alert to a user, or the like.

Controller 109 and/or processing device 130 may be and/or include a computing device such as a personal computer, a server computer, a programmable logic controller (PLC), a microcontroller, and so on. The controller 109 and/or the processing device 130 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. Controller 109 and/or processing device 130 may include a data storage device (e.g., one or more disk drives and/or solid state drives), a main memory, a static memory, a network interface, and/or other components. Processing device 130 may execute instructions to perform any one or more of the methodologies and/or embodiments described herein. The instructions may be stored on a computer readable storage medium, which may include the main memory, static memory, secondary storage and/or processing device (during execution of the instructions).

Figure 2:
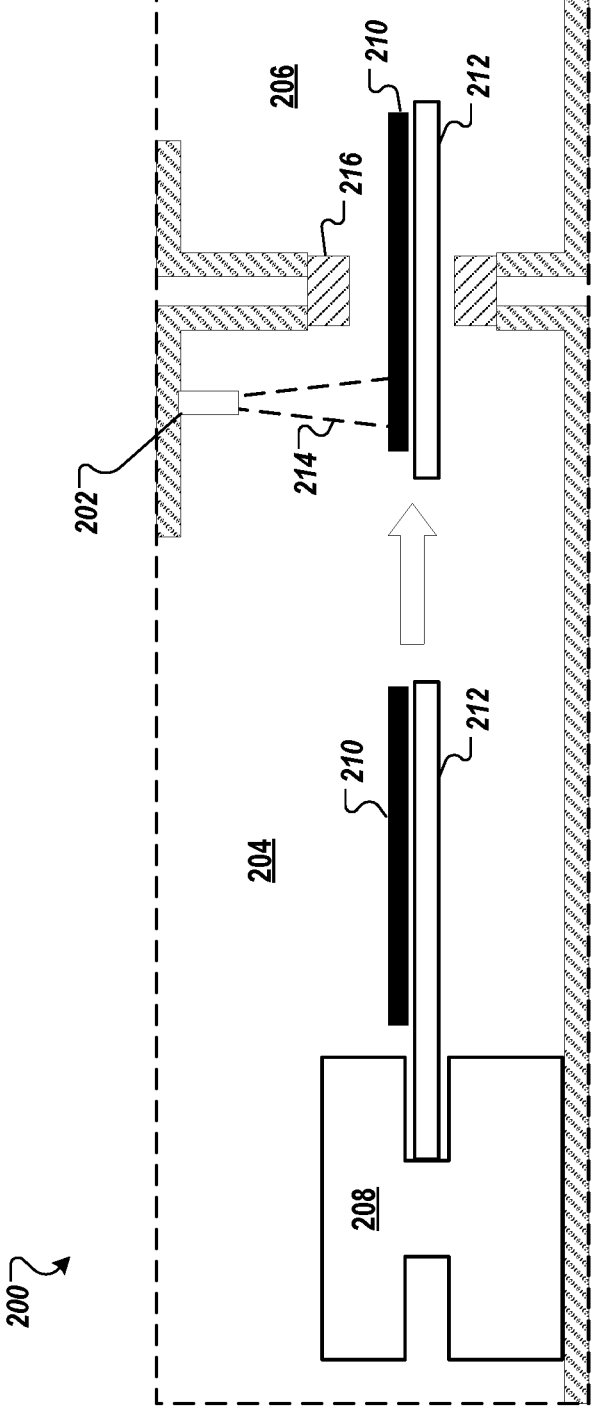
FIG. 2 is a simplified side view of substrate processing system including an electromagnetic radiation probe, according to some embodiments.

FIG. 2 illustrates a simplified side view of a substrate processing system 200 including an electromagnetic radiation probe 202, according to some embodiments. Substrate processing system includes transfer chamber 204 and process chamber 206 (e.g., transfer chamber 114 and process chamber 103 of FIG. 1). Transfer chamber 114 may include transfer robot 208. Transfer robot 208 may be configured to transfer one or more substrates within transfer chamber 204, between transfer chamber 204 and process chamber 206, between process chamber 206 and another chamber of processing system 200 (not shown), or the like.

Transfer robot 208 may be coupled to or include robot arm 212. Robot arm 212 may be configured to support substrate 210, to transfer substrate 210 between portions of substrate processing system 200, or the like. Robot arm 212 may comprise a blade and/or end effector, as will be described in more detail in connection with FIG. 3.

Transfer robot 208 may be configured to extend (as demonstrated by the arrow depicted in FIG. 2) robot arm 212 to carry substrate 210 from transfer chamber 204 to process chamber 206. One or more portions of substrate 210 may pass through a field of view 214 of probe 202. In some embodiments, probe 202 may be disposed proximate to an interface between chambers of substrate processing system 200, e.g., proximate to slit valve 216 (e.g., slit valve 111 of FIG. 1). In some embodiments (e.g., embodiments including probe 202 disposed proximate to an interface between chambers of substrate processing system 200), a portion of substrate 210 may be within field of view 214 while substrate 210 is passing from one chamber to another (as depicted in FIG. 2). In some embodiments, probe 202 is disposed at a height above a height of the slit valve, and the field of view 214 of the probe 202 point downwards. Alternatively, prove 202 may be disposed at a height below the height of the slit valve, and the field of view 214 of the probe 202 may point upwards. In some embodiments, probe 202 may be placed differently, e.g., may be configured such that a portion of substrate 210 is in field of view 214 while substrate 210 is within transfer chamber 204, such that a portion of substrate 210 is in field of view 214 while substrate 210 is within process chamber 206, etc.

In some embodiments, probe 202 may be coupled to other components associated with performing metrology, taking measurements of a substrate, etc. In some embodiments, probe 202 may comprise a detector (e.g., an electromagnetic radiation detector). In some embodiments, probe 202 may comprise a radiation collection device. In some embodiments, probe 202 may be coupled to a spectrometer, e.g., probe 202 may be coupled to a fiber optic cable that may direct radiation received by probe 202 from substrate 210 to a spectrometer. In some embodiments, probe 202 may be coupled to a detector. In some embodiments, one or more detectors associated with probe 202 may be communicatively coupled with a processing device.

In some embodiments, probe 202 may receive radiation emitted by substrate 210. For example, probe 202 may receive infrared radiation emitted by substrate 210. A processing device associated with probe 202 may determine one or more properties of substrate 210 based on radiation emitted by substrate 210. The processing device may determine a temperature of substrate 210 based on emitted radiation, chemical composition of substrate 210, etc. In some embodiments, probe 202 may comprise a part of a pyrometer system.

In some embodiments, probe 202 may be configured to receive light reflected by substrate 210. Substrate processing system 200 may include an electromagnetic radiation source, configured to illuminate at least a portion of substrate 210. In some embodiments, illumination of substrate 210 may be performed from above, e.g., to enable reflected radiation to be collected by probe 202. In some embodiments, illumination may be broadband, e.g., may be provided by a white light source. In some embodiments, illumination may be narrowband, e.g., may provide a limited span of wavelengths to substrate 210. In some embodiments, illumination may be pulsed. The spectrometer associated with probe 202 may operate in a pulsed mode, which may correspond to the pulsed mode of the illumination source (e.g., may be synchronized in time). The illumination source may be a pulsed flash lamp, e.g., a xenon flash lamp. In some embodiments, illumination may be provided via a component of probe 202, e.g., probe 202 may include two fiber optic cores, one for providing radiation to substrate 210 from a radiation source, and one for receiving reflected radiation from substrate 210 and providing the reflected radiation to an associated spectrometer.

In some embodiments, radiation used to illuminate substrate 210 may be collimated or substantially collimated. Collimated illumination may be substantially insensitive to substrate distance from the probe. In some embodiments, radiation used to illuminate substrate 210 may be focused (e.g., convergent). Convergent illumination may cause the metrology system to be substantially insensitive to substrate angle (e.g., angle of a surface of the substrate with respect to an optical axis of the metrology system). In some embodiments, radiation used to illuminate substrate 210 may be divergent. In some embodiments, collected radiation (e.g., spectral data) may be compared to a reference, e.g., a known silicon substrate reference. Comparison to a reference substrate may be utilized in background subtraction, calibration, etc.

In some embodiments, differences in substrate placement may be compensated for. For example, an additional apparatus may be included that performs measurements of angles of surfaces of substrate 210. Data indicative of an angle a substrate is placed at, an angle of a portion of the substrate (e.g., due to bowing or warping), or the like may be provided to a processing device for correcting conclusions drawn from the in-chamber metrology system.

In some embodiments, probe 202 may be configured to receive light transmitted by substrate 210. An electromagnetic radiation source may be disposed on an opposite side (with respect to substrate 210) of probe 202, e.g., below the path taken by substrate 210. Radiation may pass through substrate 210 (e.g., through one or more openings in the bottom of robot arm 212) to be collected by probe 202.

In some embodiments, probe 202 may be one of an array of probes for collected electromagnetic radiation from substrate 210. In some embodiments, a number of similar probes may be disposed in substrate processing system 200. For example, a number of probes may be arrayed such that a different portion of substrate 210 is captured by the field of view of the probes. This may generate a more complete map of properties of the substrate, may improve noise reduction and/or reduce error of conclusions or analysis based on the data from the probes, etc. In some embodiments, probes measuring different quantities may be utilized. For example, probes configured to operate in a combination of emissive, reflective, and transmissive modes may be include in substrate processing system 200. In some embodiments, multiple probes may be included that operate in different wavelength regions (e.g., targeting different portions of the electromagnetic spectrum).

In some embodiments, substrate processing system 200 may further include components configured to detect the presence and/or location of substrate 210. For example, a radiation source may be activated when a substrate enters field of view 214 (e.g., an object detection system may provide an indication that substrate had entered field of view 214, for example by having a field of view overlapping with that of field of view 214, by having a field of view entered sooner by substrate 210 and providing a delayed signal instructing the radiation source to activate, or the like), a spectrometer may be activated when a substrate enters field of view 214, etc. In some embodiments, object detection components may facilitate a synchronization of operations of the spectrometer and operations of the robot, e.g., a pulsed light source may be synchronized (utilizing the object detection system in concert with a control system of robot 208 for determining a speed of motion of substrate 210, for example) to enable data to be collected from a target portion of substrate 210, e.g., a portion near the outer edge, a portion a given distance from the outer edge, etc. In some embodiments, data points may be taken at several intervals as the substrate 210 passes through field of view 214. In some embodiments, a pulse of a pulsed radiation source may correspond to a data point. In some embodiments, and integration time of a system utilizing a continuous radiation source (along with robot speed) may define the size of a region of substrate 210 that corresponds to a data point.

In some embodiments, robot arm 212 may drift from a straight path as robot arm 212 is extended. For example, as robot arm 212 extends from a position where a first portion (e.g., the leading edge) of substrate 210 enters field of view 214 to a position where a last portion (e.g., the trailing edge) of substrate 210 exists field of view 214, placement and/or orientation of substrate 210 relative to probe 202 may change. In some embodiments, a distance between substrate 210 and probe 202 may change as robot arm 212 is extended and/or retracted. In some embodiments, and angle between substrate 210 (e.g., an angle of a ray that is normal to the surface of substrate 210) and field of view 214 (e.g., a ray through the center of field of view 214, an optical axis of the probe, etc.) may change as robot arm 212 is extended and/or retracted. In some embodiments, the value of distortion (e.g., angular droop of robot arm 212, vertical droop of robot arm 212) may be different during extension and retraction operations. In some embodiments, behavior of robot arm 212 during extension/retraction operations may be repeatable, may be predictable, may be accounted for by one or more processing devices associated with performing the measurements of the substrate in the controlled environment, etc.

Figure 3B:
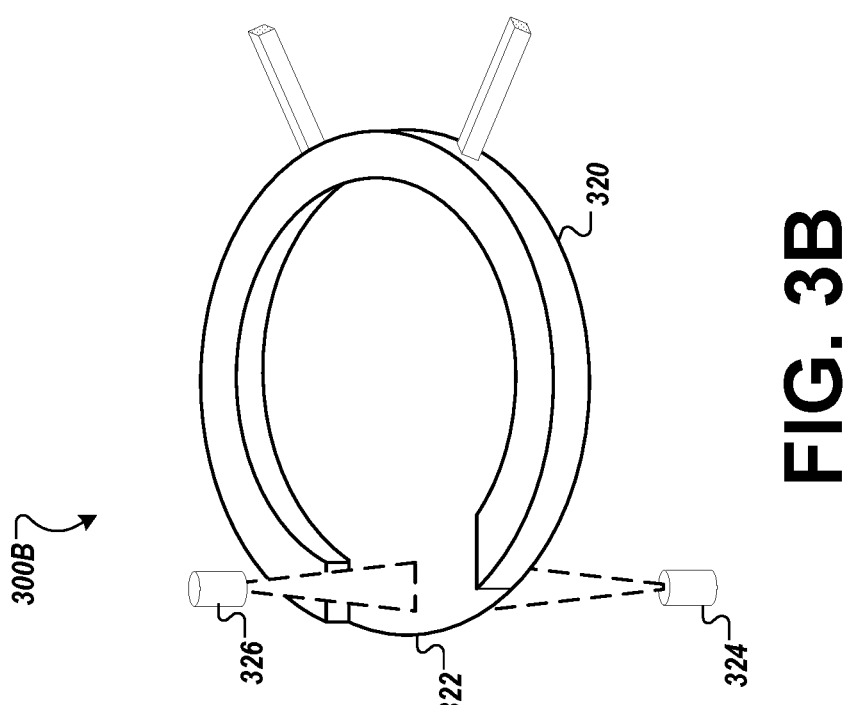
FIG. 3B is a schematic bottom view of a blade of a substrate processing system, according to some embodiments.
Figure 3A:
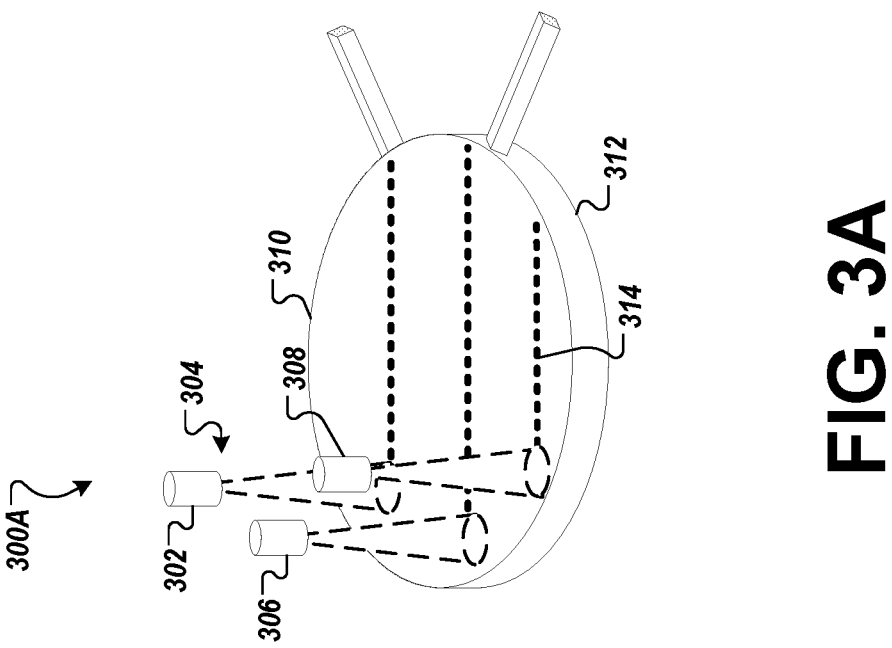
FIG. 3A is a schematic representation of a metrology system including an array of probes, according to some embodiments.

FIG. 3A is a schematic representation of a metrology system 300A including an array of probes 304, according to some embodiments. Probes 302 are configured to receive electromagnetic radiation from substrate 310 (e.g., substrate 110 of FIG. 1). In some embodiments, array of probes 304 receives electromagnetic radiation emitted by substrate 310. In some embodiments array of probes 304 receives radiation transmitted through substrate 310. In some embodiments array of probes 304 receives radiation reflected from substrate 310. In some embodiments, probes 302, 306, and 308 may comprise an array of probes. Each probe may have an associated field of view (e.g., depicted by dashed cones).

In some embodiments, each of the array probes 304 may be substantially similar, e.g., may be configured to perform similar operations, may be configured to receive electromagnetic radiation in similar wavelength ranges, etc. In some embodiments, one or more probes may perform different functions. For example, probe 302 may be configured to receive emitted radiation in a first frequency range (e.g., receive infrared radiation to perform a temperature measurement of the substrate, acting as a pyrometer, etc.), probe 306 may be configured to receive reflected radiation in a second frequency range (e.g., receive radiation in the visible wavelength range provided by a source and reflected from one or more surfaces of substrate 310), and probe 308 may be configured to receive transmitted radiation in a third frequency range (e.g., receive radiation of about 1 μm wavelength provided from the opposite side of substrate 310 by a source).

Substrate 310 may be supported by blade 312 (e.g., comprising end effector 115 of FIG. 1). Blade 312 may be coupled to a robot arm, to a transfer robot, or to any mechanism configured to transfer substrate 310 from one location (e.g., a first portion of a substrate processing system) to a second location (e.g., a second portion of the substrate processing system). Array of probes 304 may be stationary (e.g., may be secured to a wall of the substrate processing system) and may take measurements of substrate 310 as substrate 310 is transferred (e.g., through the field of view of one or more probes of the array of probes 304).

In some embodiments, probes (e.g., probe 302) may receive radiation continuously. For example, a radiation source optically coupled to probe 302 may be a continuous source. In some embodiments, a detector, sensor, spectrometer, etc. associated with a probe may be configured to process radiation in a non-continuous fashion. For example, a spectrometer may integrate data received over a span of time (e.g., as substrate 310 is being moved by blade 312), pause (e.g., separating a first region of substrate 310 in a field of view of probe 302 during data integration from a second region of substrate 310), and then integrate for a span of time. In some embodiments, the processing system may include a pulsed source. For example, the processing system may include a pulsed flash lamp source. A probe (e.g. probe 302) may receive radiation from the source dependent upon the source generating radiation, e.g., as substrate 310 moves through the field of view of probe 302, alternating regions of substrate 310 along a path across substrate 310 may be measured and not measured. In some embodiments, radiation received by probe 302 while a source is not providing radiation may be utilized in corrections, calibrations, baselining operations, etc., associated with analysis of the received radiation.

FIG. 3A further depicts example data collection path/trajectory 314. In some embodiments, a transfer robot is configured to move substrate 310 along one or more trajectories (e.g., straight trajectory segments, curved trajectory segments, etc.) for intersection with one or more fields of view of array of probes 304. Path 314 depicts a region of substrate 310 from which array of probes 304 may receive radiation. Path 314 may, for example, be associated with transferring substrate 310 from one location to another location (e.g., between a transfer chamber and a process chamber). A trajectory of substrate 310 that results in measurements along path 314 may be a normal part of operation of the processing system, e.g., data along path 314 may be collected without impacting substrate processing time, without impacting system throughput, etc. Performing in-vacuum metrology may be throughput transparent. Data may be taken along path 314 while a robot arm supporting substrate 310 is extending or retracting, for example. Data may be taken along a path resembling path 314 using a single probe, an array of probes, multiple arrays of probes (e.g., probes both above and below substrate 310), etc. Data associated with radiation received from substrate 310 (e.g., spectral data, processing data, substrate property data, etc.) may be synchronized with motion of blade 312 (e.g., to generate a map of data across a portion of the surface of substrate 310, to generate a map of properties across a portion of the surface of substrate 310, to extrapolate a map of properties across a larger portion of substrate 310 based on data associated with path 314, etc.). Additional components (e.g., an object detection system, object detection apparatus, etc.) may be utilized for synchronization of motion of blade 312 with collection/analysis of data associated with probe 308 receiving radiation from substrate 310.

In some embodiments, substrate 310 may be patterned, e.g., may be a patterned wafer. Processing of data received from a patterned wafer may include additional operations. For example, spectral data received from a patterned wafer may be compared to a database of such data. Data (e.g., spectra) substantially similar to the data received from the wafer may be utilized to characterize the substrate, characterize the pattern, etc. Binning of similar spectra, comparison of spectra, extraction of property values, etc., may be performed by a model, e.g., a physics-based model, a machine learning model, a statistical model, etc.

FIG. 3B is a schematic bottom view (viewed from the underside) of a blade 320 of processing system 300B, according to some embodiments. Blade 320 may support substrate 322. Blade 320 may be coupled to a robot arm of a transfer robot of a processing system. Metrology system 300B may include metrology components 324 and 326. In some embodiments, one or more of metrology components 324 and 326 may be probes. One or more of metrology components 324 and 326 may be sources, e.g., may be configured to direct radiation to substrate 322.

In some embodiments, a portion of the bottom of substrate 322 (e.g., a bottom surface of substrate 322 supported by blade 320) may be optically accessible while substrate 322 is on blade 320. As illustrated in FIG. 3B, blade 320 may leave a portion of substrate 322 visible from the bottom (e.g., blade 320 may be configured to contact substrate 322 along an outer rim of substrate 322). Metrology system 300B may include components both above and below a path traveled by substrate 322 (e.g., while being transferred between chambers of the processing system). In some embodiments, one or both of components 326 and 324 may represent an array, e.g., an array of probes, and array of radiation sources, or the like. In an example embodiment, component 324 may be configured to transmit light to substrate 322, and component 326 may be a probe configured to receive light transmitted through substrate 322. In a further example embodiment, component 324 may perform operations including supplying electromagnetic radiation to substrate 322 and receiving reflected radiation from substrate 322, and component 326 may receive emitted radiation from substrate 322 (e.g., for generating an indication of temperature of substrate 322).

In some embodiments, additional data may be collected from additional probes. For example, a probe positioned above or below a plane of travel of the substrate may be utilized to detect geometry of the substrate, such as a shape of the substrate, distortion of the substrate, etc. Data received from these probes may be used to correct or adjust data received by other probes. For example, a probe may be utilized to measure an angle of the upper surface of the substrate, e.g., with respect to an illumination system for performing reflectometry. Data generated by receiving reflected light may be corrected corresponding to a measured angle of a portion of the upper surface of the substrate. Wafer shape, distortion, bowing, bending, etc., may be corrected for in a similar manner.

Figure 3D:
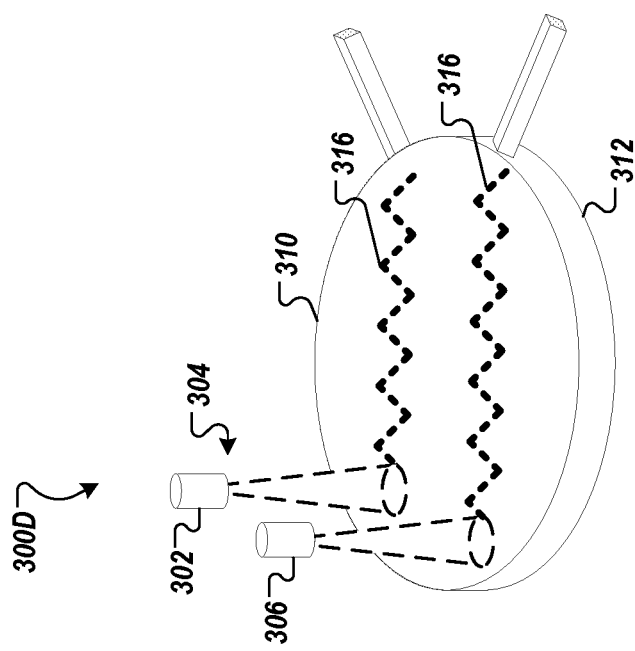
FIG. 3D is a schematic representation of a metrology system including an array of probes and collection trajectories, according to some embodiments.
Figure 3C:
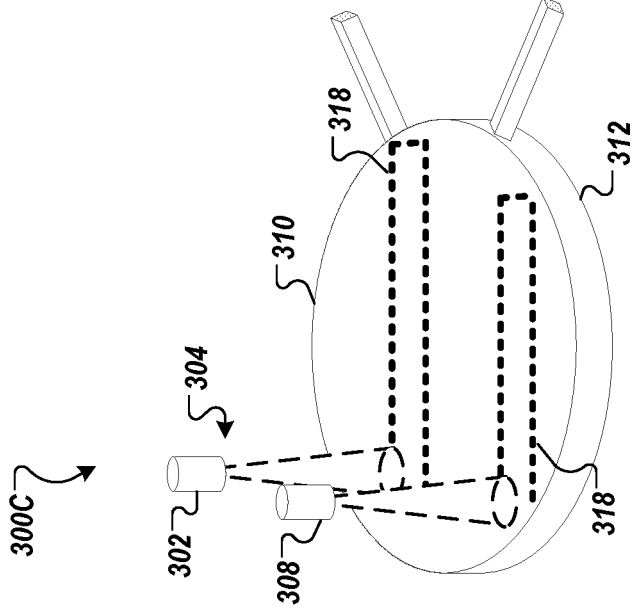
FIG. 3C is a schematic representation of a metrology system including an array of probes and collection trajectories, according to some embodiments.

FIG. 3C is a schematic representation of metrology system 300C including an array of probes 304 and path 318 (e.g., collection trajectories), according to some embodiments. Metrology system 300C may share one or more features with metrology system 300A of FIG. 3A, e.g., metrology system 300C includes an array of probes (e.g., probes 302 and 308) with associated fields of view, substrate 310, blade 312, etc. In some embodiments, a transfer robot is configured to move substrate 310 along one or more trajectories (e.g., straight trajectory segments, curved trajectory segments, etc.) for intersections with one or more fields of view of array of probes 304.

Path 318 comprises a number of trajectories. Trajectories of path 318 may be straight (as shown), curved, of various or uniform length, etc. A robot arm may be configured to move substrate 310 in a path that is not limited to bringing substrate 310 closer to a destination, e.g., a robot arm may extend and contract multiple times, along the same path repeatedly or along two or more different (e.g., parallel)

paths. In some embodiments, the robot arm moves laterally between extensions/retractions, e.g., to provide a greater area of substrate 310 to one or more fields of view of probes of array of probes 304. In some embodiments, the robot arm does not move laterally between an extension/retraction, e.g., to provide more data (e.g., repeated measurement) of a first region of substrate 310, to provide more statistical certainty, to fill in gaps (e.g., caused by integration windows, a pulsed source, etc.), or the like.

FIG. 3D is a schematic representation of metrology system 300D including an array of probes 304 and collection trajectories 316, according to some embodiments. Metrology system 300D may share one or more features with metrology system 300A of FIG. 3A, e.g., metrology system 300D includes probes 302 and 306, substrate 310, blade 312, etc. A transfer robot may be configured to move substrate 310 along trajectories shown as collection trajectories 316.

Collection trajectories 316 comprises a number of trajectories, e.g., a number of segments of a path along which the robot arm moves the substrate, a number of segments of a path a field of view traces on the surface of substrate 310, etc. Trajectories may be straight (as shown), curved, of various or uniform length, etc. In some embodiments, an indirect path (e.g., a path which does not move substrate 310 to a destination at high efficiency) may be used. Probes (e.g., probes of array of probes 304) may receive radiation from a greater portion of substrate 310 if the field of view of array of probes 304 intersects with substrate 310 in a pattern resembling collection trajectories 316, e.g., a pattern different from a straight path (e.g., path 314 of FIG. 3A). Radiation may be received along one or more collection trajectories (e.g., trajectories comprising paths/trajectories 314, 316, 318, etc.) by one probe, an array of probes, multiple arrays of probes, etc.

Figure 4:
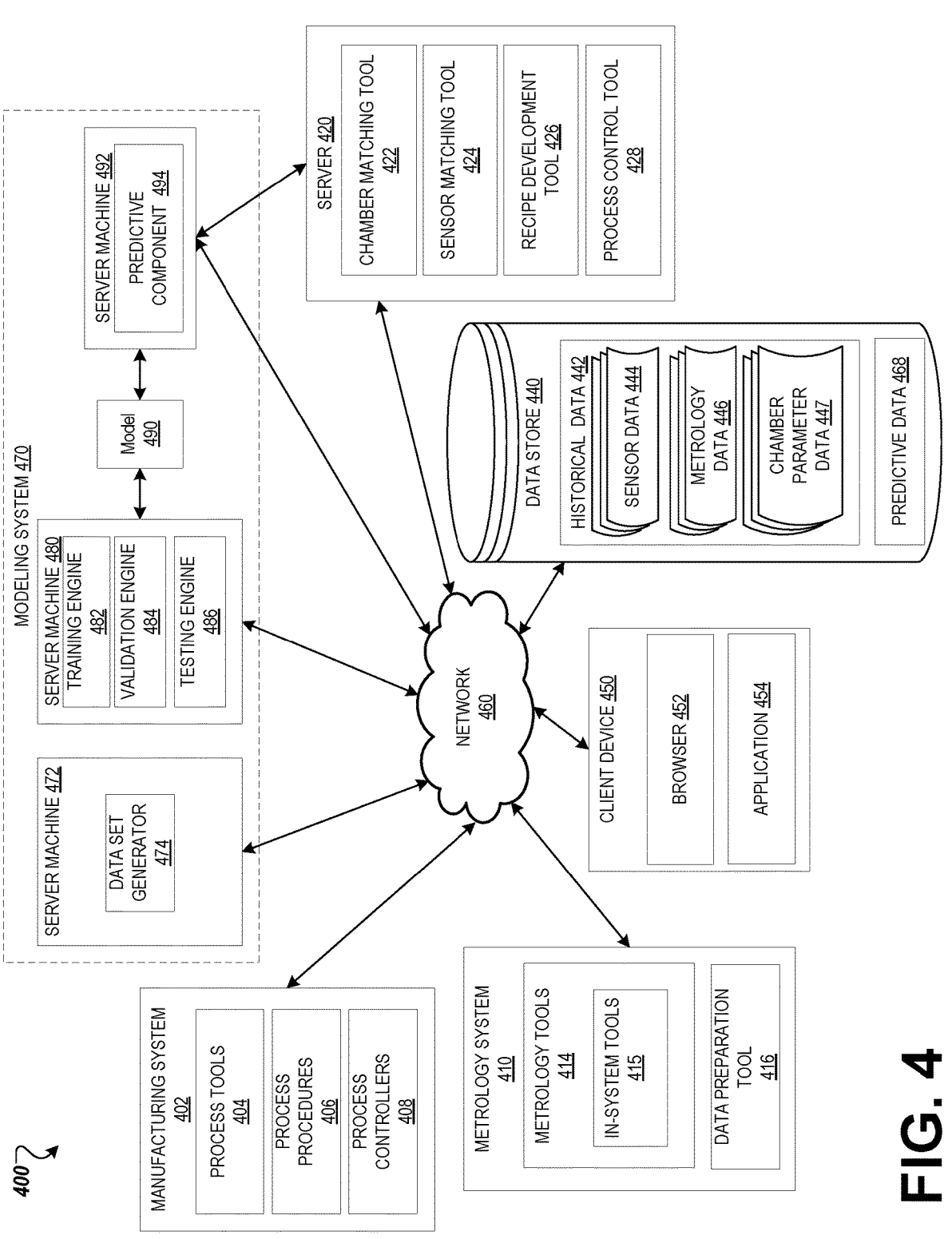
FIG. 4 is a block diagram illustrating an exemplary system architecture 400, according to some embodiments.

FIG. 4 is a block diagram illustrating an exemplary system architecture 400 in which implementations of the disclosure may operate. As shown in FIG. 4, system architecture 400 includes a manufacturing system 402, a metrology system 410, a client device 450, a data store 440, a server 420, and a modeling system 470. Metrology system 410 may include in-system tools 415 (e.g., metrology tools disposed within the area of where one or more chambers of the manufacturing system provides a controlled environment, a vacuum environment, etc.). In some embodiments, metrology system 410 may include metrology tools 414, which may include components, probes, spectrometers, radiation sources, etc., as described in connection with FIGS. 1-3. The modeling system 470 may be part of the server 420. In some embodiments, one or more components of the modeling system 470 may be fully or partially integrated into client device 450. The manufacturing system 402, the metrology system 410, the client device 450, the data store 440, the server 420, and the modeling system 470 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 402, the metrology system 410, client device 450, data store 440, server 420, and modeling system 470 may be coupled to each other via a network 460 (e.g., for performing methodology described herein). In some embodiments, network 460 is a private network that provides each element of system architecture 400 with access to each other and other privately available computing devices. Network 460 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or any combination thereof. In some embodiments, processing and/or data storage operations may be performed by remote cloud-based devices, virtual devices, etc., and network 460 may enable access to and communication with these devices. Alternatively or additionally, any of the elements of the system architecture 400 can be integrated together or otherwise coupled without the use of network 460.

Client device 450 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 450 may include a browser 452, an application 454, and/or other tools as described and performed by other systems of the system architecture 400. In some embodiments, the client device 450 may be capable of accessing the manufacturing system 402, the metrology system 410, the data store 440, server 420, and/or modeling system 470 and communicating (e.g., transmitting and/or receiving) indications of sensor data, processed data, data classifications, process result data, process update data, and/or inputs and outputs of various process tools (e.g., metrology tools 414, data preparation tool 416, chamber matching tool 422, sensor matching tool 424, recipe development tool 426, process control tool 428, and/or predictive component 494) at various stages processing of the system architecture 400, as described herein.

As shown in FIG. 4, manufacturing system 402 includes process tools 404, process procedures 406, and process controllers 408. A process controller 408 may coordinate operation of process tools 404 to perform on one or more process procedures 406. For example, various process tools 404 may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process operations.

In some embodiments, one or more of metrology tools 414 may be utilized while a substrate is transported between machine, between process operations, into or out of the manufacturing system 402, etc. For example, a radiation source of metrology tools 414 may provide electromagnetic radiation to be directed to a substrate that is being transferred from a transfer chamber to a process chamber of manufacturing system 402. The radiation source may be coupled to a component of in-system tools 415 that directs the radiation to the substrate. A probe of in-system tools 415 may receive radiation reflected from the substrate, and provide that radiation to a spectrometer of metrology system 410 for further analysis.

Process procedures 406, or sometimes referred to as process recipes, process operations, or process operations, may include various specifications for carrying out operations by the process tools 404. For example, a process procedure 406 may include process specifications such as duration of activation of a process operation, the process tool used for the operation, the temperature, flow, pressure, etc. of a machine (e.g., a chamber), order of deposition, and the like. In another example, process procedures may include transferring instructions for transporting a sample to a further process operation or to be measured by metrology system 410. One or more process procedures 406 includes preventive maintenance procedures and cleaning procedures.

Process controllers 408 can include devices designed to manage and/or coordinate the actions of process tools 404. In some embodiments, process controllers 408 are associated with a process recipe or series of process procedure instructions that when applied in a designed manner result in a desired process result of a substrate process. For example, a process recipe may be associated with processing a substrate to produce a target process result (e.g., critical dimension, thickness, uniformity criteria, etc.). Process controllers 408 can coordinate the performance of preventive maintenance procedures (e.g., chamber cleaning), chamber recovery procedures (e.g., chamber seasoning), and so on to return a chamber into a production state, and/or an update to a process operation associated with the processing chamber. Additionally, process controllers 408 can cause an update to a calibration of sensors associated with process tools 404 or metrology system 410.

As shown in FIG. 4, metrology system 410 includes metrology tools 414 and data preparation tool 416. Metrology tools 414 can include a variety of sensors to measure process results (e.g., critical dimension, thickness, uniformity, etc.) and detect parameters within the manufacturing system 402. In some embodiments, metrology tools 414 includes one or more components for generating, directing, and/or receiving electromagnetic radiation, as described in FIGS. 2-3. In some embodiments, metrology tools 414 includes a sensor to measure one or more properties of a substrate in a processing system (e.g., manufacturing system). Metrology tools 414 may include tools for performing in-line metrology, integrated metrology, standalone metrology, in-vacuum metrology, etc. Metrology tools 414 may include multiple sensors to detect conditions of the environment of the processing chamber. For example, sensors disposed within one or more processing chambers can be used to measure a condition within the processing chamber such as temperature, pressure, vacuum conditions, deposition layer thickness, and the like. In another example, metrology tools disposed within a processing chamber (e.g., probes, which may be coupled to one or more spectrometers) can be used to measure a one or more properties of a substrate of manufacturing system 402. In some embodiments, one or more sensors of system 400 (e.g., of in-system tools 415) may be utilized to collect measurements from a substrate (e.g., spectral data, data from reflected, transmitted, or emitted radiation, etc.) as the substrate is being transported by a robot of the manufacturing system. In some embodiments, one or more sensors of system 400 may be utilized to determine a chemical character (e.g., chemical composition) of a substrate, a layer of a substrate, etc. In some embodiments, one or more sensors of system 400 may be utilized to determine processing conditions associated with the substrate, to recommend corrective actions associated with metrology system 410 and/or manufacturing system 402, etc. In some embodiments, sensors of system 400 may be used to determine a thickness of a substrate. In some embodiments, metrology tools may be used to measure thickness of a process product deposited on a surface of a substrate. Metrology tools 414 may also include devices to measure process results of substrates processed using the manufacturing system. For example, process results such as critical dimensions, thickness measurements (e.g., film layers from etches, depositing, etc.) can be evaluated of substrates processed according to process recipe and/or actions performed by process controllers 408. In another example, the variety of sensors can measure conditions of a chamber over a process operation.

Data preparation tool 416 may include process methodology to extract features and/or generate synthetic/engineered data associated with data measured by metrology tools 414. In some embodiments, data preparation tool 416 can identify correlations, patterns, and/or abnormalities of metrology and/or process performance data. For example, data preparation tool 416 may perform a feature extraction where data preparation tool 416 uses combinations of measured data to determine whether a criterion is satisfied. For example, data preparation tool 416 may analyze multiple data points of an associated parameter (e.g., temperature, pressure, deposition layer thickness, vacuum conditions, plasma conditions, process product thickness, spectral data of various wavelengths of radiation, etc.) to determine whether rapid changes occurred during an iteration of a process operation. In some embodiments, data preparation tool 416 performs a normalization across the various sensor data associated with various process chamber conditions. A normalization may include processing the incoming sensor data to appear similar across the various chambers and sensors used to acquire the data. Data preparation tool 415 may prepare data to be supplied to another component for further processing, e.g., model 490.

In some embodiments, data preparation tool 416 can perform one or more of a process control analysis, univariate limit violation analysis, or a multivariate limit violation analysis on metrology data (e.g., obtained by metrology tools 414). For example, data preparation tool 416 can perform statistical process control (SPC) by employing statistics based methodology to monitor and control process controllers 408. For example, SPC can promote efficiency and accuracy of a process operation (e.g., by identifying data points that fall within and/or outside control limits).

In some embodiments, a performance (e.g., quality of performance) of one or more processing chambers can be measured throughout a processing procedure (e.g., a recipe for processing a substrate). For example, a character (e.g., thickness) of a process product deposited on a substrate in the processing chamber during a process operation (e.g., during a process recipe operation, during a cleaning operation, etc.) can be measured. For example, a substrate may be processed in multiple chambers. A substrate may enter a process chamber and be measured by one or more probes as it is transferred into the chamber (e.g., by in-system tools 415, by spectrometer 125 of FIG. 1, etc.). The substrate may undergo processing in the chamber, e.g., a deposition process, an etch process, etc. The substrate may then be removed from the processing chamber, and measured by one or more probes again while being transferred out of the processing chamber. In some embodiments, increased amounts of metrology data is taken during/between predetermined processing operations. For example, immediately after a wafer is processed, additional sensors can be activated and/or a currently activated sensor may take additional data. In some embodiments, process controllers 408 may trigger measurement by metrology tools 414 based on operations to be performed by process tools 404. For example, process controllers 408 can trigger activation of one or more sensors (e.g. of metrology tools 414) and/or one or more radiation sources responsive to an update associated with a process, e.g., completion of a processing operation, transferring of a substrate from one location in a processing system to another, etc.

In some embodiments, the extracted features, generated synthetic/engineered data, and statistical analysis can be used in association with modeling system 470 (e.g., to train, validate, and/or test model 490). Additionally and/or alternatively, data preparation tool 416 can output data to server 420 to be used by any of chamber matching tool 422, sensor matching tool 424, recipe development tool 426, and/or process control tool 428.

Data store 440 may be a memory (e.g., random access memory), a drive (e.g., a hard drive, a flash drive), a database system, or another type of component or device capable of storing data. Data store 440 may store one or more historical data 442 including historical sensor data 444, historical metrology data 446, and/or historical chamber parameter data 447 of prior chamber conditions and process results of substrates processed in the associated chamber conditions. In some embodiments, historical data 442 may be provided to train model 490. Sensor data may be provided to trained model 490 to obtain output. In some embodiments, historical sensor data 444 includes historical data from metrology system 410, e.g., spectral data generated from radiation received by a probe from a substrate. Historical sensor data 444 may include optical spectral data indicative of a thickness of a layer deposited on a substrate. Historical sensor data 444 may be indicative of another characteristic of a substrate, processing conditions of a substrate, etc.

In some embodiments, historical chamber parameter 447 may include historical updates to one or more process operations associated with a processing chamber. For example, historical chamber update data 447 may include historical updates made to one or more process operations associated with a processing chamber (e.g., cleaning recipe updates, etch recipe updates, deposition recipe updates, etc.) that were made based on historical sensor data 444. In some embodiments, historical chamber parameter data 447 may be mapped to historical sensor data 444, historical metrology data 446, etc. In some embodiments, the historical data 442 may be used to train, validate, and/or test model 490 of modeling system 470 (see e.g., FIG. 6 for exemplary methodology).

Server 420 may include one or more computing devices such as a rackmount server, a router computer, a server computer, a personal computer, a mainframe computer, a laptop computer, a tablet computer, a desktop computer, etc. The server 420 may include a chamber matching tool 422, a sensor matching tool 424, a recipe development tool 426, and a process control tool 428.

Each of the chamber matching tool 422, the sensor matching tool 424, the recipe development tool 426, and the process control tool 428 may receive data from data preparation tool 416. Each of chamber matching tool 422, sensor matching tool 424, recipe development tool 426, and process control tool 428 may receive data from model 490. Each component of server 420 may receive data from predictive component 494.

In some embodiments, each of chamber matching tool 422, sensor matching tool 424, recipe development tool 426, and process control tool 428 receives chamber data from process tools 404, and/or processed data output from data preparation tool 416. In some embodiments, data preparation tool 416 receives raw sensor data from metrology tool 414. The raw sensor data may be combined with synthetic data engineered from data preparation tool 416. Each of the chamber matching tool 422, the sensor matching tool 424, the recipe development tool 426, and the process control tool 428 may generate an update to one or more process procedures 406 and/or may generate reports/notifications indicative of chamber matching, chamber drift, anomalies, and so on.

In an example, chamber matching tool 422 may determine an update to a process operation of a first process chamber based on received data to cause the process operation performed on the first process chamber to more closely match a corresponding process operation performed on a second process chamber.

In another example, sensor matching tool 424 may determine a calibration of one or more sensors associated with a processing chamber based on the received value data. Additionally, sensor matching tool 424 may determine a sensor calibration that accounts for sensor drift based on the received value data.

In a further example, recipe development tool 426 may determine an update to a process recipe based on the received data. Specifically, recipe development tool 426 may determine an update to one or more process parameters (e.g., run time, clean time, process knobs, etc.) to optimize a process recipe (e.g., process operation) based on the received data. In one embodiment, recipe development tool 426 determines an update to a cleaning recipe that is periodically performed to clean a process chamber based on the received data.

As an additional example, process control tool 428 may determine an update to an endpoint of a process operation (e.g., an endpoint of a chamber cleaning operation) based on the received data.

The updates to process procedures may alter a manner in which a process procedure 406 is implemented by process tools 404. For example, an update may include increasing or decreasing a process time of one or more process operations of a process procedure 406. For instance, the update may increase or decrease a duration of a chamber cleaning operation. In some embodiments, each of the chamber matching tool 422, the sensor matching tool 424, the recipe development tool 426, and the process control tool 428 may use a model (e.g., a model of modeling system 470) that receives input data such as chamber data from process tools 404, metrology tools 414 including in-system tools 415, and/or processed data output from data preparation tool 416, and outputs one or more updates to process procedures 406. Model 490 may be a machine learning model and may include a bootstrap aggregation model, a random forest tree decision tree model, a partial least squares regression (PLS) model, a least absolute shrinkage and selection operator (LASSO) regression model, and/or Ridge regression model among other models. The model may include ensemble modeling comprising multiple models (e.g., stacked modeling) and leveraging higher confidence models for final classification of the received data. The model may be an unsupervised model, a semi-supervised model, or a supervised model. Additionally, the model may include a linear model, a dynamic model, a digital model, a mechanistic model, a statistical model, a physics-based model, a digital twin model, etc.

In some embodiments, one or more of the chamber matching tool 422, the sensor matching tool 424, the recipe development tool 426, and/or the process control tool 428 may perform their described methodology using a machine learning model. In some embodiments, one or more of the chamber matching tool 422, the sensor matching tool 424, the recipe development tool 426, and/or the process control tool 428 may perform their described methodology using a conventional model and/or a physics-based model (e.g., a digital twin). The associated models may be generated (e.g., trained, validated, and/or tested) using modeling system 470.

In some embodiments, modeling system 470 may include server machine 472 and server machine 480. Server machine 472 includes data set generator 474 that is capable of generating one or more data sets (e.g., a set of data inputs and a set of target outputs) to train, validate, and/or test model 190. Some operations of data set generator 474 are described in detail in connection with FIGS. 5 and 7A. In some embodiments, data set generator 172 may partition historical data (e.g., historical sensor data 444, historical metrology data 446, chamber parameter data 447, etc.) into a training set (e.g., sixty percent of the data), a validating set (e.g., twenty percent of the data), and a testing set (e.g., twenty percent of the data). In some embodiments, modeling system 470 (e.g., via predictive component 494) generates multiple sets of attributes (e.g., feature vectors, vectors, etc.). For example a first set of attributes may correspond to a first set of types of sensor data (e.g., from a first set of sensors, first combination of values from first set of sensors, first patterns in the values from the first set of sensors) that correspond to each of the data sets (e.g., training set, validation set, and testing set) and a second set of attributes may correspond to a second set of types of sensor data (e.g., from a second set of sensors different from the first set of sensors, second combination of values different from the first combination, second patterns different from the first patterns) that correspond to each of the data sets.

In some embodiments, server machine 480 includes a training engine 482, a validation engine 484, a selection engine, and/or a testing engine 486. An engine (e.g., training engine 482, validation engine 484, testing engine 486) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 482 may generate multiple trained models 490. Each trained model of the multiple trained models may correspond to a distinct set of attributes of the training set (e.g., sensor data from a distinct set of sensors). For example, a first trained machine learning model may have been trained using all attributes (e.g., X1-X5), a second trained machine learning model may have been trained using a first subset of the attributes (e.g., X1, X2, X4), and a third trained machine learning model may have been trained using a second subset of the attributes (e.g., X1, X3, X4, and X5) that may partially overlap the first subset of attributes. Data set generator 474 may receive output of a trained model (e.g., 490), and collect the data into training, validation, and testing data sets, and use the data sets to train a second model. Some or all of the operations of server machine 480 may be used to train various types of models, including physics-based models, supervised machine learning models, unsupervised machine learning models, etc.

The validation engine 484 may be capable of validating a trained model 490 using a corresponding set of features of the validation set from data set generator 474. For example, a first trained model 490 that was trained using a first set of attributes of the training set may be validated using the first set of attributes of the validation set. The validation engine 484 may determine an accuracy of each of the trained models 490 based on the corresponding sets of features of the validation set. The validation engine 484 may discard trained models 490 that have an accuracy that does not meet a threshold accuracy. In some embodiments, a selection engine (not shown) may be capable of selecting one or more trained models 490 that have an accuracy that meets a threshold accuracy. In some embodiments, the selection engine may be capable of selecting the trained model 490 that has the highest accuracy of the trained models 490.

The testing engine 486 may be capable of testing a trained model 490 using a corresponding set of attributes of a testing set from data set generator 474. For example, a first trained model 490 that was trained using a first set of attributes of the training set may be tested using the first set of attributes of the testing set. The testing engine 486 may determine a trained model 490 that has the highest accuracy of all of the trained models based on the testing sets.

Model 490 may refer to a machine learning model, which may be the model artifact that is created by the training engine 482 using a training set that includes data inputs and corresponding target outputs (correct answers for respective training inputs). Model 490 may additionally or alternatively refer to a statistical model or physics-based model. Patterns in the data sets can be found that map the data input to the target output (the correct answer), and the model 490 is provided mappings that captures these patterns. In some embodiments, model 490 may predict properties of substrates. In some embodiments, model 490 may predict failure modes of manufacturing chamber components.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs).

A recurrent neural network (RNN) is another type of machine learning model. A recurrent neural network model is designed to interpret a series of inputs where inputs are intrinsically related to one another, e.g., time trace data, sequential data, etc. Output of a perceptron of an RNN is fed back into the perceptron as input, to generate the next output.

Deep learning describes a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., recognizing structures of a substrate such as gates, masks, etc.); and the fourth layer may generate a classification output. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

Model 490 may refer to a trained physics-based model. A trained physics-based model may be configured to find solutions to one or more equations described physical quantities of a processing chamber, such as mass flow (e.g., gas flow), heat transfer equations, fluid dynamics equations, or the like. In some embodiments, assumptions used to generate the physics-based model may not be entirely accurate (e.g., due to imprecise measurements, manufacturing or material defects, mismatches of manufacturing tolerances of components, components aging, drifting, or acting differently than predicted, or the like). Training a physics-based model may correct for one or more of these assumptions that introduces error into the physics-based model, e.g., by allowing one or more parameters of the model to be altered to better fit to training data.

Predictive component 494 may provide input data to a trained model 490 and may run the trained model 490 on the input to obtain one or more outputs. Predictive component 494 may be capable of determining (e.g., extracting) predictive data 468 from the output of the model 490 and may determine (e.g., extract) confidence data from the output that indicates a level of confidence that the predictive data 468 is an accurate predictor of a process associated with the input data for products produced or to be produced, or an accurate predictor of components of manufacturing system 402. Predictive component 494 may be capable of determining predictive data 468, including predictions on finished substrate properties and predictions of effective lifetimes of components of manufacturing system 402, sensors, or metrology system 410 based on the output of model 490. Predictive component 494 or a corrective action component associated with client device 450 (e.g., a component of application 454) may use the confidence data to decide whether to cause a corrective action associated with the manufacturing system 402 based on predictive data 468.

The confidence data may include or indicate a level of confidence. As an example, predictive data 468 may indicate predicted manufacturing conditions (e.g., conditions within a processing chamber while a substrate is being processed) based on in-vacuum metrology of the substrate. The confidence data may indicate that the predictive data 468 is an accurate prediction for products associated with at least a portion of the input data. In one example, the level of confidence is a real number between 0 and 1 inclusive, where 0 indicates no confidence that the predictive data 468 is an accurate prediction for products processed according to input data and 1 indicates absolute confidence that the predictive data 468 accurately predicts properties of products processed according to input data. Responsive to the confidence data indicating a level of confidence below a threshold level for a predetermined number of instances (e.g., percentage of instances, frequency of instances, total number of instances, etc.) the predictive component 494 may cause the model 490 to be re-trained (e.g., by updating a training, validating, and/or testing set to include additional, more recent, or different data, etc.).

For purpose of illustration, rather than limitation, aspects of the disclosure describe the training of a model and use of a model using information pertaining to historical data 442. In other implementations, a heuristic model or rule-based model may be used to determine a process operation update.

In some embodiments, the functions of client devices 450, server 420, data store 440, and modeling system 470 may be provided by a fewer number of machines than shown in FIG. 4. For example, in some embodiments, server machines 472 and 480 may be integrated into a single machine, while in some other embodiments, server machine 472, 480, and 492 may be integrated into a single machine. In some embodiments, the modeling system 470 may be fully or partially provided by server 420. In some embodiments, functions of client device 450, server 420, data store 440, and modeling system 470 may be provided by a greater number of machines than shown in FIG. 4.

In general, functions described in one embodiment as being performed by client device 450, data store 440, metrology system 410, manufacturing system 402, and modeling system 470 can also be performed on server 420 in other embodiments, if appropriate. In addition, the functionality attributed to a particular component can be performed by different or multiple components operating together.

In some embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 5:
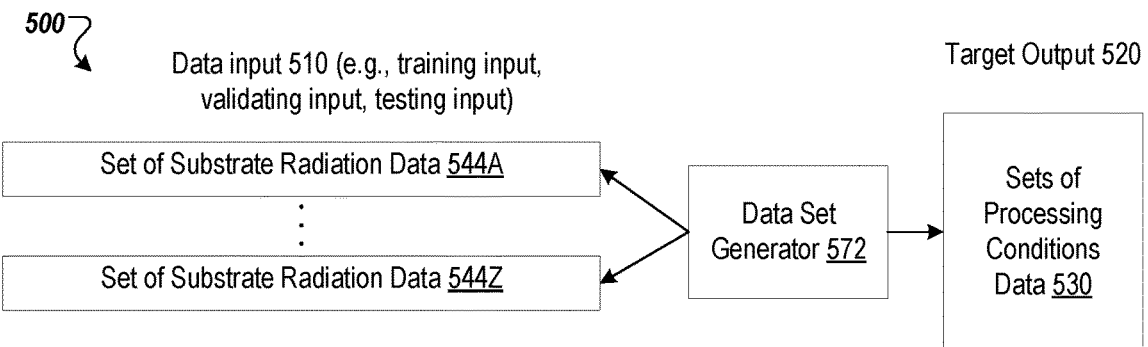
FIG. 5 is a block diagram of an example data set generator used to create data sets for one or more models, according to some embodiments.

FIG. 5 is a block diagram of an example data set generator 572 (e.g., data set generator 474 of FIG. 4), used to create data sets for a model (e.g., model 490 of FIG. 3), according to some embodiments. Data set generator 572 may be part of server machine 472 of FIG. 4. In some embodiments, modeling system 470 of FIG. 4 may include multiple models. Each model may have a separate data set generator, or models may share one or more data set generators. For example, different models may be utilized to accept different inputs (e.g., manufacturing parameters, sensor data, metrology data, spectral data, e.g.), to generate different outputs (e.g., predicted metrology, predicted manufacturing conditions, recommended corrective actions), to engage in different types of analysis (e.g., machine learning, physics-based, statistical), or the like.

In some embodiments, a model may be configured to accept as input data related to electromagnetic radiation received by a probe from a substrate (e.g., spectral data) and to generate as output one or more indications of characteristics of the substrate (e.g., thickness; geometry such as critical dimension, etch depth, or sidewall angle; pattern uniformity; optical properties; chemical properties; etc.). Such a model may include machine learning operations, physics-based operations, etc. In some embodiments, a model is to receive one or more indications of properties of a substrate (e.g., an indication of one or more properties of the substrate at one or more locations of the substrate coinciding with the field of view of one or more probes) and generate as output a predicted map of properties in other regions of the substrate (e.g., for a system with one probe, properties of locations that are not located on a path directly in the field of view of the probe as the substrate is transferred from one portion of the processing system to another portion through the field of view of the probe). In some embodiments, a model is to receive as input one or more indications of characteristics of the substrate and generate output indicative of processing conditions of the substrate (e.g., indicative of processing conditions that resulted in the properties of the substrate). In some embodiments, a model is to receive data associated with radiation received from the substrate (e.g., spectral data) and generate as output a prediction of processing conditions of the substrate. In some embodiments, a model is to receive data (e.g., spectral data, property data, etc.) and generate one or more indications of properties of a top layer of the substrate (e.g., the model may receive data collected from the substrate before and after a processing operation). In some embodiments, a model is to receive input data (e.g., spectral data, property data, etc.) and generate as output one or more recommended corrective actions, and/or is to cause performance of one or more corrective actions.

Figure 6:
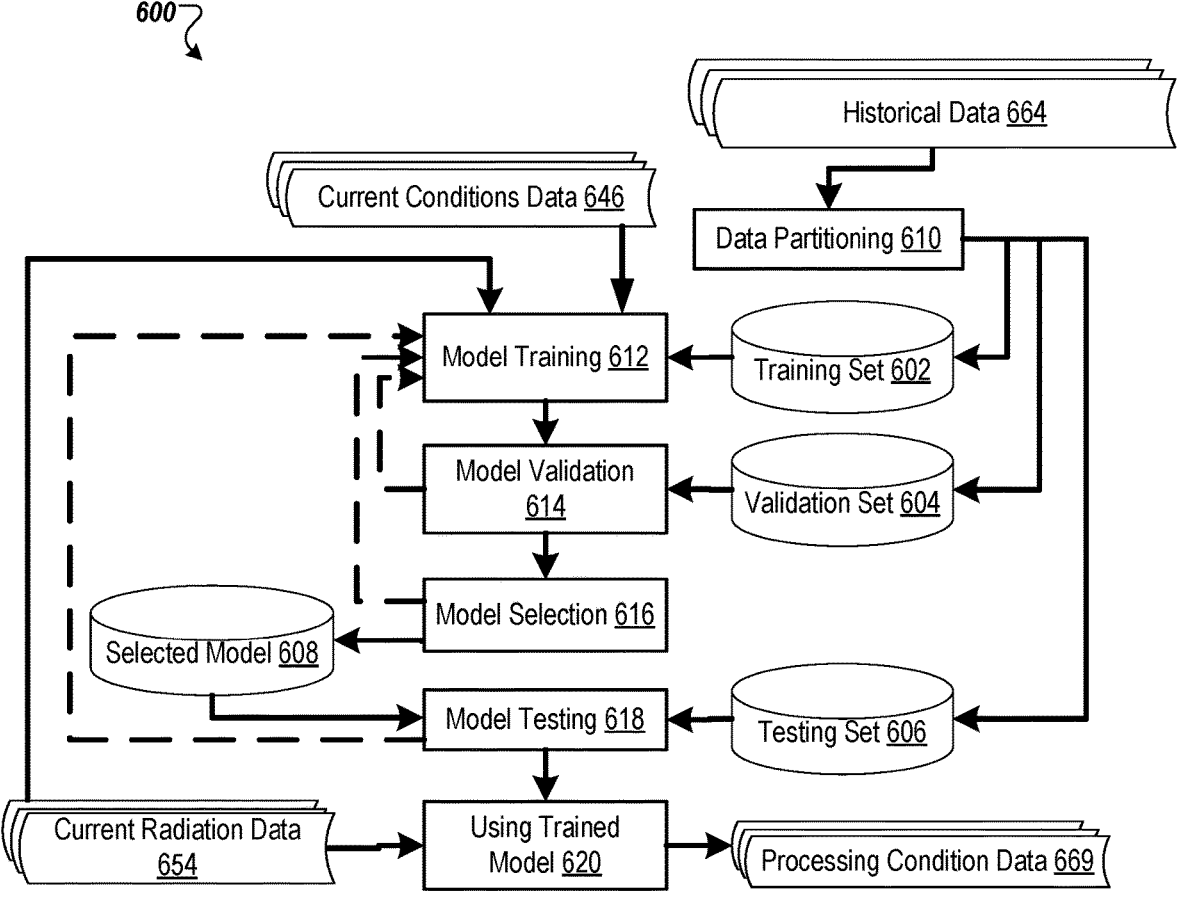
FIG. 6 is a block diagram of a system for generating output data for performance of a corrective action, according to some embodiments.

Discussion of FIGS. 5-6 will be centered around systems and operations associated with a machine learning model configured to receive spectral data (e.g., collected by a probe from a substrate that was being transferred by a transfer robot from one location in a processing system to a second location of the processing system) and generate as output an indication of processing conditions associated with processing the substrate. Analogous methods and systems may be utilized for different machine learning models (e.g., models that receive different data as input and/or generate different data as output), different types of models (e.g., physics-based models, statistical models), etc., and be within the scope of this disclosure.

System 500 containing data set generator 572 creates data sets for a model (e.g., model 490 of FIG. 4). Data set generator 572 may create data sets using historical data. Data set generator 572 may create data sets using data generated by metrology tools, e.g., data generated from receiving electromagnetic radiation from a substrate in a processing system by one or more probes. Data set generator 572 may create data sets using data indicative of processing conditions of a substrate, e.g., data from a device configured to measure conditions at or near the location of a substrate, sensor data from a processing chamber, etc.

Data set generator 572 generates data input 510. Data set generator 572 may also create target output 520. In some embodiments, e.g., for training an unsupervised machine learning model, data set generator may not create target output 520. Data set generator 572 may generate data input 510 utilizing substrate radiation data. Substrate radiation data may be associated to radiation emitted by substrates. Substrate radiation data may be associated with radiation reflected by one or more substrates. Substrate radiation data may be associated with radiation transmitted through the substrate. Substrate radiation data may be associated with radiation received by one or more probes of a processing system (e.g., a substrate processing system) while one or more substrates had been moving within the processing system (e.g., data collected while one or more substrates are transferred between portions of the processing system). Substrate radiation data may be spectral data. Substrate radiation data may include combinations of data, e.g., data collected by multiple probes, data associated with multiple radiation sources (e.g., reflected and emitted light), etc. Target output 520 may include processing conditions data. Processing conditions data may be generated by an instrument (e.g., designed to be disposed at or near a processing location). Processing conditions data may be generated by sensors associated with a processing system (e.g., substrate processing system).

Data sets may include preprocessed data, e.g., smoothed, cleaned (outliers removed, etc.), combined, collected into feature vectors or attributes, etc.

Data set generator 572 may generate a data set (e.g., training set, validating set, testing set) that includes one or more data inputs 510 (e.g., training input, validating input, testing input) and may include one or more target outputs 520 that correspond to the data inputs 510. The data set may also include mapping data that maps the data inputs 510 to the target outputs 520. Data inputs 510 may also be referred to as "features," "attributes," or "information." In some embodiments, data set generator 572 provides one or more data sets to the training engine, validating engine, and/or testing engine of FIG. 4. Data may be used by the engine to train, validate, or test a model 490 of FIG. 4. Some embodiments of generating a training set, validating set, or testing set may be further described in connection with FIG. 7A.

Data set generator 474 may generate a first data input corresponding to a first set of substrate radiation data 544A to train, validate, or test a first model. Data set generator 572 may generate a second data input corresponding to a second set of sensor data 544B to train, validate, or test a second model.

In some embodiments, data set generator 474 performs operations on one or more of data input 510 and target output 520. Data set generator 572 may extract patterns from the data (slope, curvature, etc.), may combine data (average, feature generation, etc.), or may separate data into groups (e.g., train a model on a subset of the substrate radiation data) and use the groups to train separate models.

Data inputs 510 and target outputs 520 to train, validate, or test a model may include information for a particular substrate processing recipe (e.g., a particular substrate design). Data inputs 510 and target outputs 520 may include information for a particular substrate processing system (e.g., for a particular set of manufacturing equipment). Data inputs 510 and target outputs 520 may include information for a particular type of processing, target substrate property, type of processing equipment, processing facility, or may be grouped together in another way.

In some embodiments, data set generator 572 generates a set of target output 520, including sets of processing conditions data 530. Target output 520 may be separating into sets corresponding to sets of input data. Different sets of target output 520 may be used in connection with the similarly defined sets of data input 510, including training different models, using different sets for training, validating, and testing, etc.

In some embodiments, a model is trained without target output 520 (e.g., an unsupervised or semi-supervised model). A model trained that is not provided with target output may, for example, be trained to recognize significant (e.g., outside an error threshold) differences between predicted and measured data (e.g., between processing condition set points and processing conditions implied by in-vacuum metrology of a substrate being transferred by a robot arm of a processing system).

In some embodiments, information used to train the model may be from specific types of manufacturing equipment, e.g., of a manufacturing facility. The types of manufacturing equipment contributing to data sets of data set generator 572 may share one or more characteristics, such as make and/or model of equipment. A trained model may be able to generate output relevant to a group of manufacturing equipment tools based on the data input 510 and target output 520 used to train the model. In some embodiments, data used to train a model may originate from two or more manufacturing facilities.

In some embodiments, subsequent to generating a data set and training, validating, or testing a model using the data set, the model may be further trained, validated, or tested, or adjusted. For example, additional data may be provided to the model from substrates processed after the model was trained, validated, and tested as retraining data, revalidating data, retesting data, or the like.

Data set generator 572 may generate data sets to train, validate, and/or test a model. Training a model may include generating model mappings that the model utilizes to connect input data to output data.

A data set generate performing similar functions to data set generator 572 may be utilized to train a physics-based model. A physics-based model may be configured to generate an output based on a physical understanding of a system, based on physical assumptions of the operation of a system, based on one or more numerical solutions to one or more physical equations (e.g., heat transfer equations, mass balance equations, fluid dynamics equations, etc.), or the like. A physics-based model may be trained in a similar manner to a machine learning model. The physics-based model may be provided with training input and target output, and may adjust one or more parameters, weights, biases, or the like, to bring model output into better alignment with the target output.

In some embodiments, a physics-based model receives a set of inputs (e.g., indicative of radiation received by a probe from a substrate). The physics-based model may generate an output based on the input (e.g., predicted processing conditions of the substrate). The physics-based model may be provided with a target output (e.g., measured processing conditions of the substrate). The physics-based model may adjust one or more parameters of the model to generate output that is more similar to the target output than before the adjustment was made.

FIG. 6 is a block diagram illustrating system 600 for generating output data for performance of a corrective action, according to some embodiments. System 600 may be used to train a model (e.g., a machine learning model) and to utilize output of the model. Some or all operations of system 600 may be used to generate output data of a machine learning model. Some or all of operations of system 600 may be used to generate output data of a physics-based model, a statistical model, etc.

At block 610, system 600 (e.g., components of modeling system 470 of FIG. 4) performs data partitioning (e.g., via data set generator 474 of FIG. 4) of historical data 664 to generate training set 602, validation set 604, and testing set 606. Historical data may include data used for training input (e.g., spectral data generated in-vacuum from radiation received from one or more substrates), target output (e.g., data indicative of processing conditions of the one or more substrates), etc. For example, the training set may be 60% of the historical data, the validation set may be 20% of the historical data, and the testing set may be 20% of the historical data.

At block 612, system 600 performs model training (e.g., via training engine 484 of FIG. 4) using the training set 602. System 600 may train one model or may train multiple models using multiple sets of features (e.g., attributes, feature vectors) of the training set 602 (e.g., a first set of attributes including a subset of historical data of the training set 602, a second set of attributes including a different subset of historical data of the training set 602, etc.). For example, system 300 may train a machine learning model to generate a first trained machine learning model using the first set of attributes in the training set and to generate a second trained machine learning model using the second set of attributes in the training set (e.g., different data than the data used to train the first machine learning model). In some embodiments, the first trained machine learning model and the second trained machine learning model may be combined to generate a third trained machine learning model (e.g., which may be a better predictor than the first or the second trained machine learning model on its own). In some embodiments, sets of attributes used in comparing models may overlap (e.g., one model may be trained with performance data indicative of film thickness, and another model with performance data indicative of both film thickness and film stress, different models may be trained with data from different locations of a substrate, models may be trained including input from a different set of sensors or manufacturing parameters, etc.). In some embodiments, hundreds of models may be generated including models with various permutations of attributes and combinations of models.

At block 614, system 600 performs model validation (e.g., via validation engine 484 of FIG. 4) using validation set 604. System 600 may validate each of the trained models using a corresponding set of features of the validation set 604. For instance, validation set 604 may use the same subset of historical data types (e.g., associated with the same substrate characteristics, the same sensors, the same input parameters, etc.) used for the model in training set 602, but with different input data values. System 600 may validate hundreds of models (e.g., models with various permutations of features or attributes, combinations of models, etc.) generate at block 612. At block 614, system 600 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow may return to block 612 where system 600 performs model training using different sets of attributes of the training set. Responsive to determining that one or more of the trained models has an accuracy that meets a threshold accuracy, flow may continue to block 616. System 600 may discard the trained machine learning models that have an accuracy that is below the threshold accuracy (e.g., based on the validation set).

At block 616, system 600 may perform model selection (e.g., via a selection engine) to determine which of the one or more trained models that meet the threshold accuracy has the highest accuracy (e.g., the selected model 608, based on the validating of block 614). If only a single model was trained (e.g., was accurate in validation above the accuracy threshold), then the operations of block 616 may be skipped. Responsive to determining that two or more of the trained models that meet the threshold accuracy have the same accuracy (e.g., within a threshold), flow may return to block 612 where system 600 performs model training using further refined training sets (e.g., corresponding to further refined sets of attributes) for determining a trained model that has the highest accuracy.

At block 618 system 600 performs model testing (e.g., via testing engine 486 of FIG. 4) using the testing set 606 to test selected model 608. System 600 may test, using the first set of features in the testing set, the first model (e.g., trained machine learning model) to determine the first trained model meets a threshold accuracy (e.g., based on the first set of features of the testing set 606). Responsive to accuracy of selected model 608 not meeting the threshold accuracy (e.g., the selected model 608 is overly fit to the training set 602 and/or validation set 604 and is not applicable to other data sets such as testing set 606), flow may continue to block 612 where system 600 performs model training (e.g., retraining) using different training sets possibly corresponding to a different sets of feature or attributes or a reorganization of data sets split into training, validation, and testing sets. Responsive to determining that selected model 608 have an accuracy that meets a threshold accuracy based on the testing set 606, flow continues to block 620. In at least block 612, the model may learn patterns in input data to make predictions and in block 618, system 600 may apply the model on the remaining data (e.g., testing set 606) to test the predictions.

At block 620, system 600 uses the trained model (e.g., selected model 608) to receive current radiation data 654 (e.g., data based on radiation received from a substrate under processing) and determines (e.g., predicts), via the trained model, processing conditions used to process the current substrate (e.g., processing condition data 669). Processing condition data 669 may be utilized in performance of a corrective action, e.g., to improve processing conditions of a processing chamber by updating a recipe, scheduling maintenance, providing an alert to a user, etc.

In some embodiments, retraining of the model occurs by supplying additional data to further train the model. Current radiation data 654 may be provided for further model training (e.g., may be provided to a training engine to be used as training input). Current conditions data 646 (e.g., measurement of processing conditions of a substrate) may be provided to a model training engine, e.g., to be used as target output. Selected model 608 may be retrained based on this data. One or more of the acts 610-620 may occur in various orders and/or with other acts not presented and described herein. In some embodiments, one or more of acts 610-620 may not be performed. For example, in some embodiments, one or more of data partitioning of block 610, model validation of block 614, model selection of block 616, or model testing of block 618 may not be performed. In training a physics-based model, a subset of the described operations may be performed.

Figure 7A:
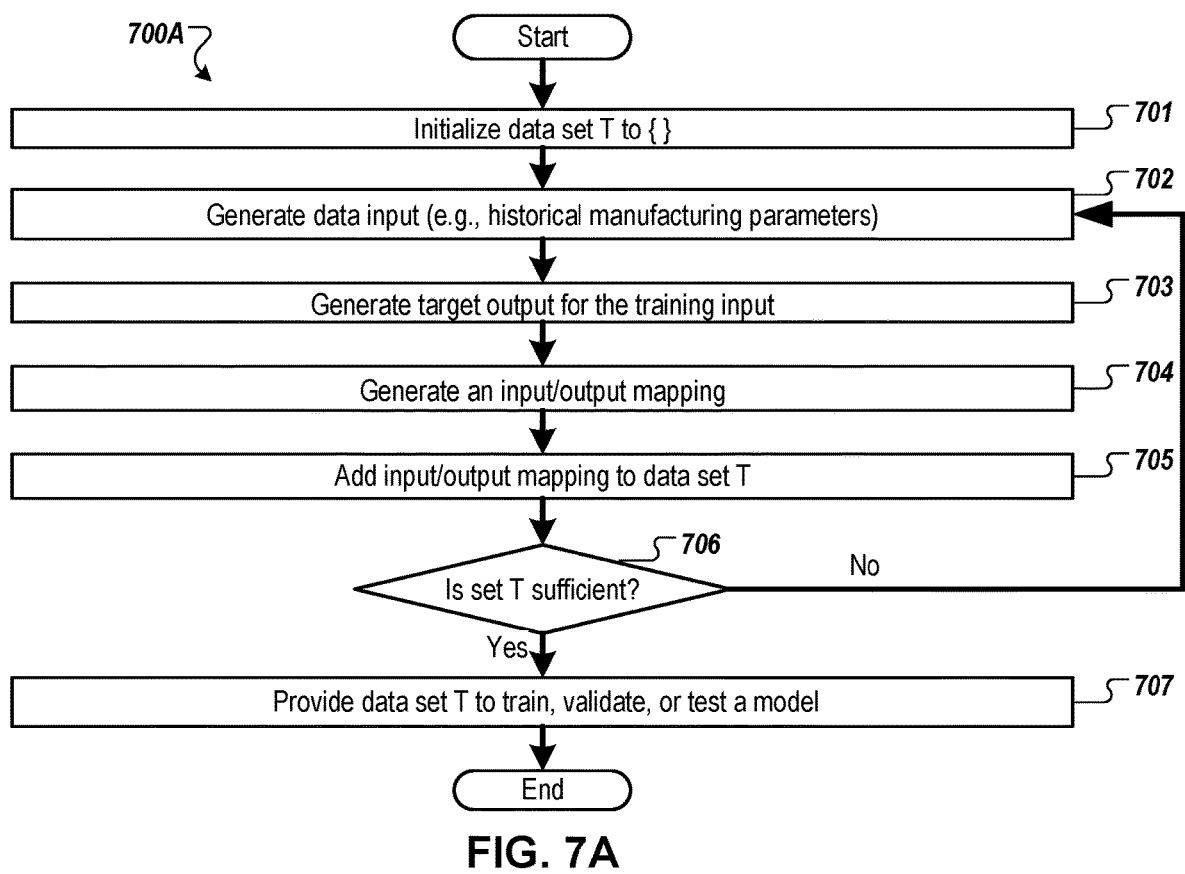
FIG. 7A is a flow diagram of a method for generating a data set for a model for generating output data, according to some embodiments.
Figure 7B:
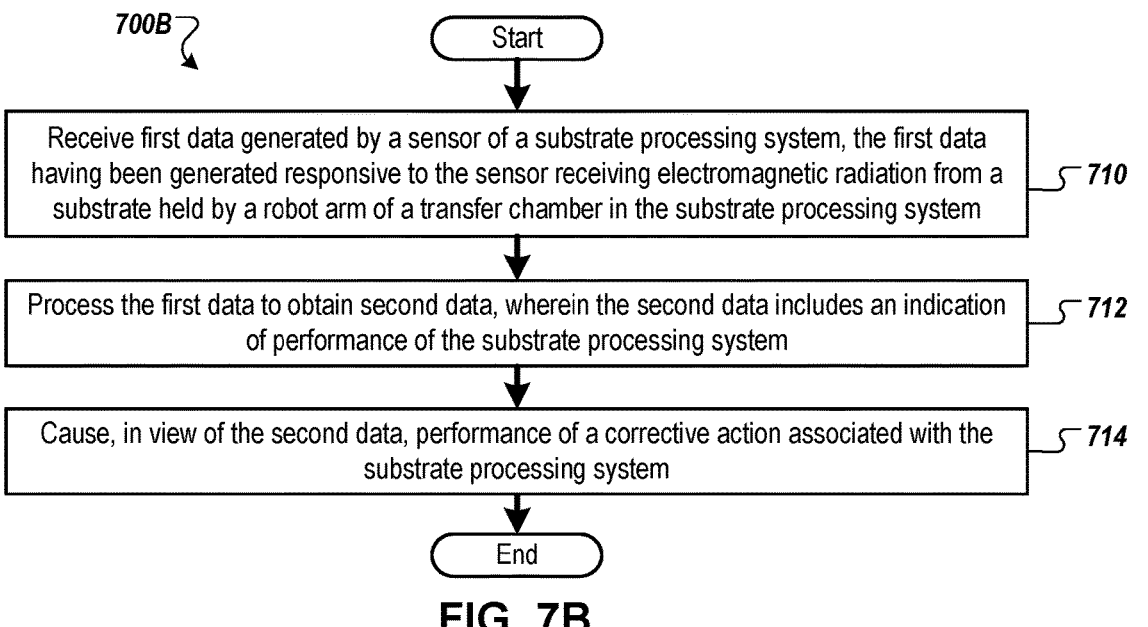
FIG. 7B is a flow diagram of a method for generating and utilizing data based on radiation received by a probe while a substrate is within a processing system, according to some embodiments.

FIGS. 7A-C are flow diagrams of methods 700A-C associated with utilizing in-chamber electromagnetic radiation-based metrology, according to some embodiments. Methods 700A-C may be performed by processing logic that that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 700A-C may be performed, in part by modeling system 470 of FIG. 4. Method 700A may be performed, in part, my modeling system 470 of FIG. 4 (e.g., data set generator 474 of FIG. 4). Modeling system 470 may use method 700A to generate a data set to at least one of train, validate, or test a model, in accordance with embodiments of the disclosure. The model may be a physics-based model, a machine learning model, a statistical model, or another model trained to receive input and generate output related to substrate manufacturing or processing. Methods 700B-C may be performed by processing device 130 of FIG.

1, metrology system 410 of FIG. 4, etc. In some embodiments, a non-transitory storage medium stores instructions that, when executed by a processing device (e.g., of modeling system 470, of system 400, of server machine 480, etc.) cause the processing device to perform one or more of methods 700A-C.

For simplicity of explanation, methods 700A-C are depicted and described as a series of operations. However, operations in accordance with this disclosure may occur in various orders and/or concurrently and with other operations not presented and described herein. Furthermore, not all illustrated operations may be performed to implement methods 700A-C in accordance with the disclosed subject matter. In addition, those skilled in the art will understand and appreciate that methods 700A-C could alternatively be represented as a series of interrelated states via a state diagram of events.

FIG. 7A is a flow diagram of a method 700A for generating a data set for a model for generating output data, according to some embodiments. At block 701, processing logic implementing method 700A initialized a training set T to an empty set.

At block 702, processing logic generates first data input (e.g., first training input, first validating input) that may include sensor data, manufacturing parameter data, measured substrate performance data, substrate metrology data (e.g., film properties such as thickness, material composition, optical properties, roughness, and so on), etc. In some embodiments, the first data input may include a first set of attributes for types of data and a second data input may include a second set of attributes for types of data (e.g., as described with respect to FIG. 6).

At block 703, processing logic generates a first target output for one or more of the data inputs (e.g., first data input). In some embodiments, the first target output is performance data of substrates. In some embodiments, the first target output is data indicative of a corrective actions. In some embodiments, no target output is generated (e.g., for training an unsupervised machine learning model).

At block 704, processing logic optionally generates mapping data that is indicative of an input/output mapping. The input/output mapping (or mapping data) may refer to the data input (e.g., one or more of the data inputs described herein), the target output for the data input, and an association between the data input(s) and the target output. In some embodiments (e.g., those without target output data) these operations may not be performed.

At block 705, processing logic adds the mapping data generated at block 404 to data set T, in some embodiments.

At block 706, processing logic branches based on whether data set T is sufficient for at least one of training, validating, and/or testing a model (e.g., model 490 of FIG. 4). If T is sufficient, execution proceeds to block 707, otherwise, execution continues back at block 702. It should be noted that in some embodiments, the sufficiency of data set T may be determined based simply on the number of inputs, mapped in some embodiments to outputs, in the data set, while in some other implementations, the sufficiency of data set T may be determined based on one or more other criteria (e.g., a measure of diversity of the data examples, accuracy, span of the input and/or output spaces, etc.) in addition to, or instead of, the number of inputs.

At block 707, processing logic provides data set T (e.g., to server machine 480 of FIG. 4) to train, validate, and/or test a model (e.g., model 190). In some embodiments, data set T is a training set and is provided to training engine 482 of server machine 4780 to perform the training. In some embodiments, data set T is a validation set and is provided to validation engine 484 of server machine 480 to perform the validating. In some embodiments, data set T is a testing set and is provided to testing engine 486 of server machine 480 to perform the testing.

FIG. 7B is a flow diagram of a method 700B for generating and utilizing data based on radiation received by a probe while a substrate is within a processing system, according to some embodiments. Method 700B may include receiving radiation from a substrate while the substrate is in a controlled environment (e.g., vacuum). Method 700B may include receiving radiation from a substrate while the substrate is moving (e.g., while a robot is transferring the substrate from one location of a substrate processing system to another).

At block 710, processing logic receives first data. The first data is generated by a sensor of the substrate processing system (e.g., via a probe, spectrometer, and processing device/processor of the substrate processing system). The first data may include spectral data. The first data is generated responsive to the sensor receiving electromagnetic radiation. The electromagnetic radiation is received from a substrate. The substrate is held by a robot arm of a transfer chamber in the substrate processing system. The first data may be generated responsive to electromagnetic radiation being received (e.g., by a probe, by the sensor, by a spectrometer, etc.) while the robot arm is transferring the substrate from a first region of the substrate processing system to a second region of the substrate processing system. In some embodiments, radiation may be directed to/received by one or more sensors while a substrate is being transferred, e.g., in a throughput transparent way. In some embodiments, a robot arm may be configured to alter/adjust a path of a substrate to increase, alter, or improve data generated by a sensor. In some embodiments, the robot may transfer the substrate through multiple trajectories, e.g., to increase a portion of the substrate that has intersected a field of view of one or more probes.

In some embodiments, data of a substrate may be recorded multiple times. For example, as a portion of a substrate passes through a field of view of a sensor, electromagnetic radiation received from the substrate may be separated into a number of data points, e.g., each corresponding with a different spatial location of the substrate. One or more of these regions (e.g., one associated with the first data, other locations associated with other data, etc.) may have associated data analyzed. A map or partial map of measured properties, processing conditions, or the like may be generated by receiving electromagnetic radiation from multiple locations of a substrate. In some embodiments, a profile of the substrate (e.g., a thickness profile, a temperature profile, etc.) may be generated utilizing spatially distinct (e.g., separated) data.

In some embodiments, one or more operations of a sensor may be triggered. For example, an object detection system (e.g., a laser object detection system, object detection apparatus, etc.) may detect the presence of a substrate at a location of the substrate processing system. Responsive to the detection of the substrate, one or more operations of the sensor may be initiated, altered, etc. In some embodiments, a speed of the robot arm supporting the substrate may be utilizing in determining a timing of operation of the sensor. In some embodiments, a detection apparatus may be activated at a target time responsive to object detection. In some embodiments, an illumination apparatus (e.g., a source of electromagnetic radiation) may be activated responsive to object detection. In some embodiments, an illumination apparatus may be operated in a pulsed mode, and a timing may be altered responsive to object detection, e.g., to target a particular region of a substrate for illumination (e.g., an edge, a distance from the edge, the center, etc.).

In some embodiments, additional data is generated by additional sensors, e.g., additional probes. For example, an array of probes may generate data associated with additional locations of the substrate (e.g., to improve statistical certainty, to improve knowledge of a full substrate profile, etc.). Multiple probes may report on different properties (e.g., substrate thickness and substrate temperature), different wavelength ranges of radiation, different illumination condition (e.g., reflected, transmitted, emitted, etc.), or the like. Data may be processed into different forms, e.g., temperature data, thickness data, corrective action data, processing condition data, etc. Data from additional probes and/or sensors may be utilized similarly to the first.

In some embodiments, data collected (e.g., data provided by sensors) may be corrected, e.g., to account for operation of the substrate processing system. For example, a robot arm may differ from ideal behavior as a function of location, speed, direction of movement, percent extension, or the like. In some embodiments, the robot arm may hold a substrate at varying angles depending on position and motion of the robot arm. Data may be corrected for this effect. In some embodiments, the robot arm may hold a substrate at varying heights depending on position and motion of the robot arm. Data may be corrected for this effect.

At block 712, processing logic processes the first data to obtain second data. The second data includes an indication of performance (e.g., quality of performance) of the substrate processing system. The second data may include one or more indications of properties of the substrate. The second data may include one or more characteristics of the substrate, such as thickness, chemical composition, optical properties, surface pattern, etc. The second data may include optical data such as absorption spectra, reflectance spectra, or the like. The second data may include geometry of the substrate, such as etch depth, sidewall angle, critical dimension, etc. The second data may include substrate shape, substrate distortion, bowing, etc. The second data may include one or more indications of a state of the substrate processing system or quality of performance of the substrate processing system. The second data may include one or more indications of conditions under which the substrate had been processed by the substrate processing system. The second data may include potential problems of the processing system, such as unexpected processing conditions, incorrect or insufficient calibrations, or the like.

In some embodiments, processing the first data may include providing the first data to a model. The first data may be provided to a machine learning model, a physics-based model, a statistical model, or the like. A model may perform one or more of many different functions. A model may receive data generated by one or more sensors and generate data indicative of substrate properties (e.g., thickness, chemical character, temperature, etc.). A model may receive data indicative of properties associated with one or more spatial regions of a substrate (e.g., regions arranged in a line across a substrate, based on radiation collected as the substrate is being moved past the field of view of a probe) and generate a map of properties of the substrate, e.g., including one or more regions from which radiation was not collected. A model may receive data indicative of one or more substrate properties and generate one or more indications of processing conditions of the substrate. A model may receive data indicative of one or more substrate properties and generate a recommended corrective action and/or perform a recommended corrective action. A model may receive data associated with radiation received from a substrate (e.g., spectral data) and generate one or more indications of processing conditions of the substrate. A model may receive data associated with radiation received from the substrate and generate and/or enact one or more recommended corrective actions. A model may receive data and generate an indication of properties of a single layer of a substrate (e.g., radiation from a substrate may be collected before and after a processing operation is performed, e.g., by a probe disposed proximate a coupling between a processing chamber and a transfer chamber of a substrate processing system). In some embodiments, multiple models may be utilized. In some embodiments, models may be utilized sequentially (e.g., spectral data may be provided to a model to generate property data, and the property data may be provided to a model to generate a recommendation of a corrective action). In some embodiments, an ensemble model (e.g., a model performing operations of multiple models) may be utilized.

A model (e.g., a machine learning model) may be trained by providing historical data. In some embodiments, the historical data may be associated with substrates generated to train the model. For example, many substrates may be generated with processing conditions specifically and/or intentionally varied to build up data for an input space and/or output space of a model.

At block 714, processing logic causes, in view of the second data, performance of a corrective action associated with the substrate processing system. A corrective action may include, for example, updating a process recipe, scheduling maintenance, providing an alert to a user, etc.

FIG. 7C is a flow diagram of a method 700C for performing a corrective action in view of one or more characteristics of a substrate, according to some embodiments. At block 720, processing logic receives first data. The first data may share one or more features with the first data of FIG. 7B. The first data is generated by a sensor of a substrate processing system. The sensor may be a spectrometer. The first data is generated responsive to the sensor receiving electromagnetic radiation from a substrate. The substrate is held by (e.g., supported by, supported on, etc.) a robot arm. The robot arm is in the substrate processing system (e.g., coupled to a transfer chamber of the substrate processing system). The radiation may be received by the sensor while the robot arm is moving the substrate, e.g., measurements may be taken while the substrate is being transferred. Measurements may be taken while the substrate is transferred from one chamber (e.g., a transfer chamber, a processing chamber, a load lock, etc.) to another chamber. The sensor may include a probe (e.g., for receiving radiation). The probe may be at least partially disposed within the processing system (e.g., embedded in a wall of the system). The processing system may include one or more probes, one or more arrays of probes, one or more sensors, etc.

At block 722, the first data is provided, by processing logic, to a model. The model may be a physics-based model, a machine learning model, etc. The model may be configured to receive optical data, radiation data, spectral data, etc., as input and generate output based on the input data.

At block 724, processing logic obtains, from the model, second data. The second data indicates one or more characteristics of the substrate. The characteristics may include one or more of physical properties, optical properties, electrical properties, current conditions (e.g., temperature), etc. The characteristics may include select layers or groups of layers of the substrate. The characteristics may include thickness, refractive index, extinction coefficient, temperature, etc. Probes and/or sensors may be used to determine target characteristics, e.g., a pyrometer probe may be utilized to determine temperature, a broadband (e.g., sensitive to white light) reflectometer may be utilized to determine film thickness, etc. In some embodiments, the model may receive historical measurements (e.g., measurements from before one or more processing operations) as further input (e.g., to isolate properties of a deposited or etched layer or the substrate).

At block 726, processing logic causes performance of a corrective action. The corrective action may include process/feedback control (e.g., updating one or more processing recipes in view of the characteristics determined by the model). The corrective action may include scheduling metrology (e.g., of a substrate that is potentially out of target specifications). The corrective action may include scheduling maintenance (e.g., corrective or preventative maintenance). The corrective action may include initiating maintenance (e.g., a chamber cleaning or chamber seasoning procedure).

Figure 8:
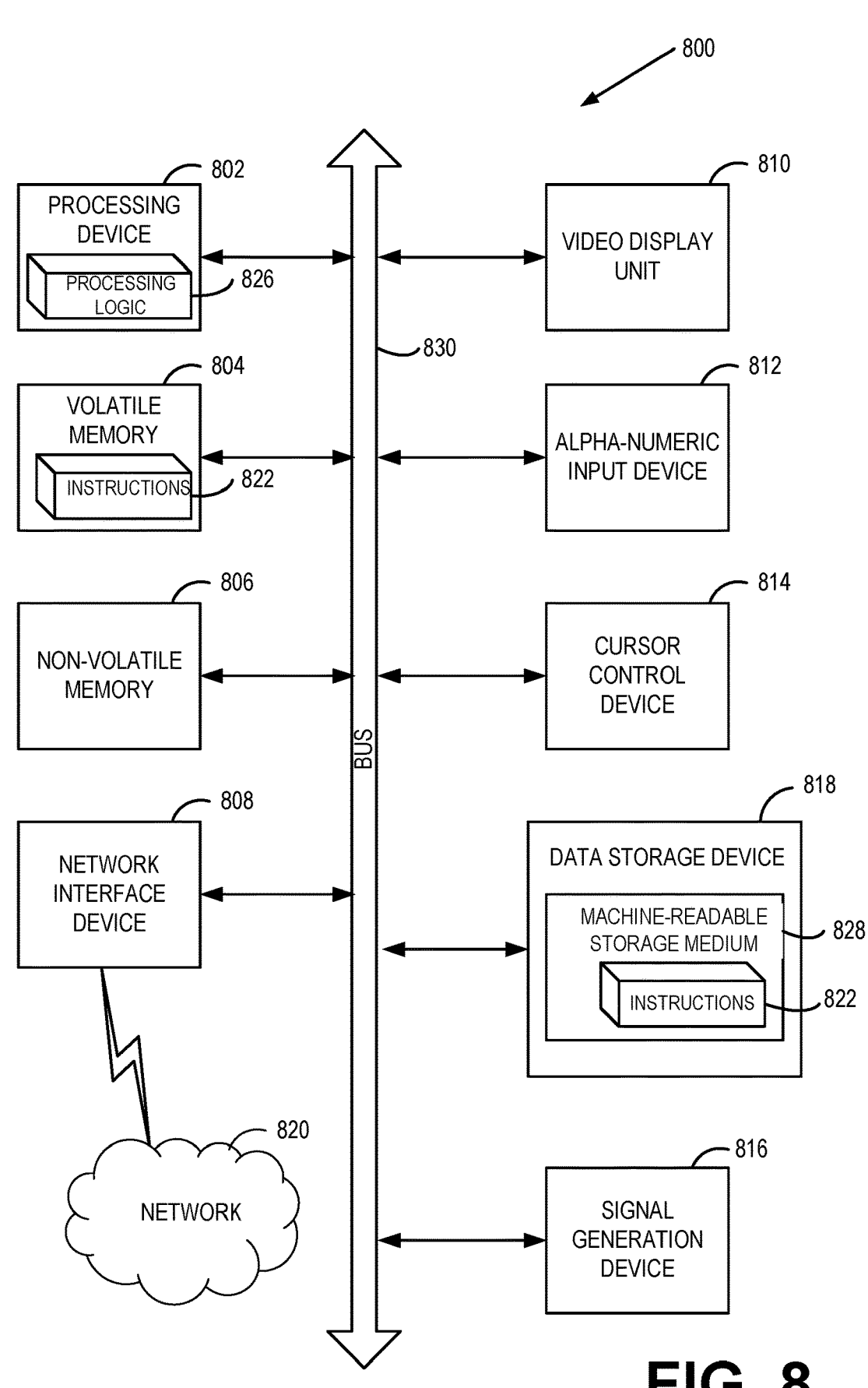
FIG. 8 depicts a block diagram of an example computing device, according to some embodiments.

FIG. 8 depicts a block diagram of an example computing device, operating in accordance with one or more aspects of the present disclosure. In various illustrative examples, various components of the computing device 800 may represent various components of the client devices 450, metrology system 410, server, 420, data store 140, and modeling system 470, illustrated in FIG. 4.

Example computing device 800 may be connected to other computer devices in a LAN, an intranet, an extranet, and/or the Internet. Computing device 800 may operate in the capacity of a server in a client-server network environment. Computing device 800 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 800 may include a processing device 802 (also referred to as a processor or CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processing device 802 represents one or more general-purpose processing devices such as a microprocessor, central processing unit, or the like. More particularly, processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 802 may be configured to execute instructions implementing methods 700A-C illustrated in FIGS. 7A-C, and/or processes illustrated in FIG. 6.

Example computing device 800 may further comprise a network interface device 808, which may be communicatively coupled to a network 820. Example computing device 800 may further comprise a video display 810 (e.g., a liquid crystal display (LCD), a touch screen, or a cathode ray tube (CRT)), an alphanumeric input device 812 (e.g., a keyboard), a cursor control device 814 (e.g., a mouse), and an acoustic signal generation device 816 (e.g., a speaker).

Data storage device 818 may include a computer-readable storage medium (or, more specifically, a non-transitory machine-readable storage medium) 828 on which is stored one or more sets of executable instructions 822. In accordance with one or more aspects of the present disclosure, executable instructions 822 may comprise executable instructions associated with any of the methods disclosed herein, e.g., instructions for performing any methods disclosed herein. Executable instruction 822 may be associated with executing methods illustrated in FIG. 6, and/or methods 700A-C illustrated in FIGS. 7A-C.

Executable instructions 822 may also reside, completely or at least partially, within main memory 804 and/or within processing device 802 during execution thereof by example computing device 800, main memory 804 and processing device 802 also constituting computer-readable storage media. Executable instructions 822 may further be transmitted or received over a network via network interface device 808.

While the computer-readable storage medium 828 is shown in FIG. 9 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting,"

"causing," "returning," "comparing," "creating," "stopping," "loading," "copying," "throwing," "replacing," "performing," "receiving," "processing," "generating," "triggering," "training," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
receiving, by a processing device, first data generated by a first sensor of a substrate processing system, the first data having been generated responsive to the first sensor receiving electromagnetic radiation from a substrate held by a robot arm of a transfer chamber in the substrate processing system while the substrate is being moved by the robot arm;
processing the first data to obtain second data, wherein the second data comprises a first indication of performance of the substrate processing system;
receiving third data from the first sensor, wherein the first data is associated with a first portion of the substrate and the third data is associated with a second portion of the substrate;
processing the third data to obtain fourth data, wherein the fourth data comprises a second indication of performance of the substrate processing system; and
causing, in view of the second data and the fourth data, performance of a corrective action associated with the substrate processing system.

2. The method of claim 1, wherein the first data comprises spectral data, and wherein the second data comprises an indication of a thickness of the substrate.

3. The method of claim 1, wherein the second data comprises an indication of conditions under which the substrate had been processed by the substrate processing system.

4. The method of claim 1, wherein the first sensor receives the electromagnetic radiation from the substrate while the robot arm is transferring the substrate from a first region of the substrate processing system to a second region of the substrate processing system.

5. The method of claim 1, further comprising:
generating a profile of the substrate in view of the third data and the fourth data.

6. The method of claim 1, further comprising:
receiving a signal from an object detection apparatus, the signal indicating presence of the substrate at a first location of the substrate processing system; and
triggering an operation of the first sensor responsive to receiving the signal from the object detection apparatus, wherein triggering an operation of the first sensor comprises causing the first sensor to detect electromagnetic radiation from the substrate at a target time, the target time being based on (i) a time at which the object detection apparatus indicated presence of the substrate at the first location and (ii) a speed at which the substrate is being transferred by the robot arm.

7. The method of claim 1, further comprising:
receiving fifth data generated by one or more additional sensors of the substrate processing system, wherein the first sensor and the one or more additional sensors form an array of sensors, the fifth data having been generated responsive to the one or more additional sensors receiving electromagnetic radiation from one or more regions of the substrate different from a region of the substrate from which the first sensor received electromagnetic radiation; and
processing the fifth data to obtain sixth data, wherein the sixth data comprises a third indication of performance of the substrate processing system.

8. The method of claim 1, further comprising:

receiving fifth data generated by a second sensor of the substrate processing system; and processing the fifth data to obtain sixth data, wherein the sixth data comprises a third indication of performance of the substrate processing system, and wherein the first sensor is to receive electromagnetic radiation of a first range of wavelengths, and wherein the second sensor is to receive electromagnetic radiation of a second range of wavelengths.

9. The method of claim 8, wherein the sixth data comprises temperature data of the substrate, and wherein the first sensor is configured to receive radiation reflected from the substrate.

10. The method of claim 1, further comprising:

receiving a plurality of sensor data associated with a first plurality of substrates after the first plurality of substrates have been processed by an etch process or a deposition process;

receiving a plurality of data indicative of processing conditions of the first plurality of substrates; and training a machine learning model by providing the plurality of sensor data to the machine learning model as training input and providing the plurality of data indicative of processing conditions to the machine learning model as target output.

11. The method of claim 1, wherein processing the first data to obtain second data comprises providing the first data to a trained machine learning model, wherein the trained machine learning model is configured to receive sensor data as input and generate an indication of processing conditions of the substrate as output.

12. A substrate processing system, comprising:

a process chamber;

a transfer chamber coupled to the process chamber;

a robot arm of the transfer chamber configured to transfer a substrate between the process chamber and the transfer chamber;

a first sensor having a first field of view, wherein at least a portion of the first field of view includes at least a portion of the substrate as the substrate is transferred to or from the process chamber by the robot arm, wherein the first sensor is to receive electromagnetic radiation that has interacted with the substrate;

a pyrometer; and a processing device to process data, the data generated responsive to the first sensor receiving electromagnetic radiation, to determine at least one of (i) one or more indications of performance of the substrate processing system or (ii) one or more properties of the substrate.

13. The substrate processing system of claim 12, further comprising a source of electromagnetic radiation, wherein the first sensor comprises an electromagnetic probe, and wherein the electromagnetic probe is disposed to receive electromagnetic radiation generated by the source that has interacted with the substrate.

14. The substrate processing system of claim 13, wherein the electromagnetic radiation that has interacted with the substrate comprises electromagnetic radiation reflected from a surface of the substrate.

15. The substrate processing system of claim 13, wherein the electromagnetic radiation that has interacted with the substrate comprises electromagnetic radiation transmitted through the substrate.

16. The substrate processing system of claim 12, wherein the first sensor is to receive infrared radiation emitted by the substrate.

17. The substrate processing system of claim 12, further comprising one or more additional sensors, the first sensor and the one or more additional sensors comprising an array of sensors, a second sensor of the array of sensors having a second field of view, wherein the second field of view includes a second portion of the substrate, different from the at least a portion of the substrate included in the first field of view.

18. The substrate processing system of claim 12, wherein the processing device is to process data comprising:

first data associated with electromagnetic radiation received by the first sensor from a first region of the substrate at a first time; and second data associated with electromagnetic radiation received by the first sensor from a second region of the substrate at a second time, wherein the first region is different from the second region.

19. The substrate processing system of claim 12, wherein the first sensor is to receive electromagnetic radiation reflected from the substrate and the pyrometer is to receive electromagnetic radiation emitted from the substrate.

20. A non-transitory machine readable storage medium storing instructions which, when executed, cause a processing device to perform operations comprising:

receiving first data generated by a first sensor of a substrate processing system, the first data having been generated responsive to the first sensor receiving electromagnetic radiation from a substrate held by a robot arm of a transfer chamber in the substrate processing system while the substrate is being moved by the robot arm;

processing the first data to obtain second data, wherein the second data comprises first one or more property values of the substrate;

receiving third data from the first sensor, wherein the first data is associated with a first portion of the substrate and the third data is associated with a second portion of the substrate;

processing the third data to obtain fourth data, wherein the fourth data comprises second one or more property values of the substrate; and causing, in view of the second data, performance of a corrective action associated with the substrate processing system.

21. The non-transitory machine readable storage medium of claim 20, wherein the operations further comprise:

receiving fifth data generated by the first sensor of the substrate processing system; and processing the fifth data to obtain third one or more property values of the substrate, wherein:

the first data, the fifth data, and the third data are each generated responsive to the first sensor receiving electromagnetic radiation from the substrate while the substrate is being transferred by the robot arm;

the first data corresponds to a first spatial region of the substrate, the third data corresponds to a second spatial region of the substrate, and the fifth data corresponds to a third spatial region of the substrate; and the first spatial region is different from the second spatial region, and the third spatial region is different from the first and second spatial regions.

22. The non-transitory machine readable storage medium of claim 21, wherein the robot arm is configured to transfer the substrate according to a first trajectory and a second trajectory, wherein:

the first trajectory causes a first portion of the substrate to intersect with a field of view of the first sensor;

the second trajectory causes a second portion of the substrate to intersect with the field of view of the first sensor;

the first portion includes the first spatial region; and the second portion includes the second spatial region.

23. The non-transitory machine readable storage medium of claim 20, wherein processing the first data to obtain second data is performed in view of at least one of:

an angle of a surface of the substrate with respect to an optical axis of the first sensor; or a distance of the surface of the substrate from one or more components of the first sensor.

24. The non-transitory machine readable storage medium of claim 20, wherein the operations further comprise:

receiving fifth data generated by a second sensor of the substrate processing system, the fifth data having been generated responsive to the second sensor receiving electromagnetic radiation from the substrate; and processing the fifth data to obtain sixth data, wherein the sixth data comprises an indication of a temperature of the substrate, and wherein the first sensor is to receive electromagnetic radiation of a first range of wavelengths and the second sensor is to receive electromagnetic radiation of a second range of wavelengths.

\* \* \* \* \*